United States Patent
Shibata

(10) Patent No.: US 7,233,516 B2
(45) Date of Patent: Jun. 19, 2007

(54) SEMICONDUCTOR DEVICE AND METHOD FOR FABRICATING THE SAME

(75) Inventor: Yoshiyuki Shibata, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 116 days.

(21) Appl. No.: 11/058,372

(22) Filed: Feb. 16, 2005

(65) Prior Publication Data
US 2005/0286292 A1    Dec. 29, 2005

(30) Foreign Application Priority Data
Jun. 23, 2004    (JP)    .............. 2004-185045

(51) Int. Cl.
*G11C 11/24* (2006.01)
(52) U.S. Cl. .............. 365/149; 365/102; 257/296; 257/297
(58) Field of Classification Search .............. 257/296, 257/298; 365/149, 51, 63
See application file for complete search history.

(56) References Cited

U.S. PATENT DOCUMENTS 5,814,547 A * 9/1998 Chang .............. 438/329
5,838,603 A * 11/1998 Mori et al. .............. 365/63

FOREIGN PATENT DOCUMENTS

| JP | 11-087636 | 3/1999 |
| JP | 2000-232076 A | 8/2000 |

OTHER PUBLICATIONS

Web Document About Capacitance By Answers.com ( 7 pages ).*

* cited by examiner

*Primary Examiner*—Andy Huynh
*Assistant Examiner*—Thinh T Nguyen
(74) *Attorney, Agent, or Firm*—McDermott Will & Emery LLP

(57) ABSTRACT

A semiconductor device includes a first DRAM section formed on a semiconductor substrate and composed of a plurality of first memory cells and a second DRAM section formed on the semiconductor substrate and composed of a plurality of second memory cells. The operating speed of the first DRAM section is higher than that of the second DRAM section, and the capacitance of each said first memory cell is larger than that of each said second memory cell.

6 Claims, 14 Drawing Sheets

SEMICONDUCTOR DEVICE AND METHOD FOR FABRICATING THE SAME

CROSS-REFERENCE TO RELATED APPLICATIONS

This application claims priority under 35 U.S.C. §119 on Patent Application No. 2004-185045 filed in Japan on Jun. 23, 2004, the entire contents of which are hereby incorporated by reference.

BACKGROUND OF THE INVENTION

(1) Field of the Invention

The present invention relates to a semiconductor device in which a CMOS logic section and a plurality of DRAM sections used for different applications are formed together on the same semiconductor substrate, and more particularly relates to a DRAM-embedded system LSI having a reduced power consumption and an increased processing speed while ensuring a sufficient signal holding characteristic.

(2) Description of Related Art

In recent years, DRAM-embedded system LSI (large scale integrated) chips have been attracting public attention. In a DRAM-embedded system LSI chip, a CMOS (complementary metal oxide semiconductor) logic section and a general-purpose DRAM (dynamic random access memory) section as a memory device, which used to be formed on separate chips, are formed together on the same chip to satisfy a demand for diversified semiconductor devices (see Japanese Unexamined Patent Publication No. 2000-232076).

For example, a DRAM-embedded system LSI chip used for an image processing application, or the like, includes a DRAM section as a memory device for storing an image information signal, and a CMOS logic section for retrieving necessary information from the DRAM section and performing an arithmetic operation based on the retrieved information, and the DRAM section and the CMOS logic section are formed together on the same chip.

A DRAM-embedded system LSI chip as described above realizes a higher communication speed than that realized by older techniques where data or information is exchanged between a CMOS logic section and a DRAM section that are formed on separate chips. A semiconductor device in which a CMOS logic section and a plurality of DRAM sections are formed together on the same chip includes, for example, a CMOS logic section formed on a silicon substrate and a DRAM section including trench capacitors or stacked capacitors. In this relation, the trench capacitors represent cell capacitors (memory cell capacitors) of a particular type formed in the silicon substrate, and the stacked capacitors represent cell capacitors of a particular type formed on the silicon substrate.

It was technically difficult to form a CMOS logic section and a DRAM section together on the same chip because they had large areas. However, with recent miniaturization techniques, a DRAM-embedded system LSI chip having a chip size less than or equal to 100 mm² has been realized. Now, a plurality of CMOS logic sections and a plurality of application-specific DRAM sections are formed on the same chip, whereas a single chip accommodated only one CMOS logic section and one application-specific DRAM section with older techniques.

SUMMARY OF THE INVENTION

However, the DRAM sections formed on a conventional DRAM-embedded system LSI chip all have cell capacitors of the same structure. Therefore, it is difficult to provide, on the same chip, a DRAM section that needs to be accessed at a high speed and a DRAM section that requires a sufficient signal holding characteristic. This problem will be further discussed below.

FIG. 14A is a plan view illustrating a general configuration of a conventional DRAM-embedded system LSI chip. As illustrated in FIG. 14A, a CMOS logic section 11 is formed on a chip 10, and a first DRAM section 12 and a second DRAM section 13 having the same cell capacitor structure are formed on the same chip 10. The first DRAM section 12 is associated with the CMOS logic section 11 and needs to operate at a high speed. On the other hand, the second DRAM section 13 is intended to operate at a low power consumption while holding a signal sufficiently long (for example, at an operating temperature of 85 through 100° C. for approximately a few or more msec).

The value of a signal stored in each memory cell of a DRAM is determined based on the charge stored in the capacitor of the memory cell. FIG. 14B is a graph illustrating the relationship between the reference charge and the charge stored in a cell capacitor of the first DRAM section 12 and the second DRAM section 13 illustrated in FIG. 14A. Referring to FIG. 14B, where the reference charge, based on which the value of a signal is determined, is set at Qs, the value of a signal stored in a memory cell of each of the first DRAM section 12 and the second DRAM section 13 is determined to be "high" when a charge Qh, which is larger than the reference charge Qs, is stored in the cell capacitor and to be "low" when a charge Ql, which is smaller than the reference charge Qs, is stored in the cell capacitor.

However, even if the charge Qh is stored in the cell capacitor (whereby the signal stored in the memory cell is supposed to be determined to be "high"), the state of the signal being held in the cell capacitor may change over time due to, for example, a leak current through the capacitor insulating film of the cell capacitor, an OFF-state leak current through the transfer transistor, or a leak current from the substrate contact portion (a portion where the cell capacitor and the semiconductor substrate are connected to each other) to the semiconductor substrate. As a result, even if a charge that is large enough for the signal to be determined "high" is initially stored in a cell capacitor of the DRAM section, the stored charge may gradually leak out over time, whereby the signal of the cell capacitor is no longer determined to be "high". Where Qh is the charge initially stored in a cell capacitor, t is the charge holding time, which is the amount of time elapsed since the charge Qh is initially stored, Q' is the amount of charge stored in the cell capacitor after the charge holding time t, and $I_{leak}$ is the amount of leak current, i.e., the amount of charge that leaks out of the cell capacitor, Q' can be expressed as in Expression (1) below. For the sake of simplicity, it is assumed that the leak current $I_{leak}$ is constant over time.

$$Q'=Qh-I_{leak} \cdot t \tag{1}$$

As can be seen from Expression (1), the charge stored in the cell capacitor of the DRAM section decreases over time. Therefore, where a sufficient signal holding characteristic is required (i.e., where it is required that the charge holding time t, which is the amount of time until the charge Q' decreases to be less than or equal to Qs, is long), the charge Qh initially stored in the cell capacitor needs to be increased. Thus, the capacitance of the cell capacitor needs to be as large as about 30 fF.

FIG. 14C is an equivalent circuit diagram illustrating a memory cell of the second DRAM section 13 (the DRAM section that is intended to hold a signal written thereto sufficiently long) illustrated in FIG. 14A. As illustrated in FIG. 14C, one of electrodes of a cell capacitor C is connected through a transfer transistor T to a bit line 14, and a plate potential $V_p$ is applied to the other electrode of the cell capacitor C. The gate electrode of the transfer transistor T is connected to a word line 15. Where the capacitance of the cell capacitor C is set at 30 fF and a voltage $V_D$ applied across the cell capacitor C is set at 1.0 V, a charge of 30 fC is stored in the cell capacitor C.

On the other hand, for the first DRAM section 12 (the DRAM section from/to which signals are read/written at a high speed, i.e., the DRAM section operating at a high frequency), the voltage to be applied to the cell capacitor (operating voltage) is switched at a higher speed than for the second DRAM section 13. Therefore, the next operation is accidentally started before the voltage to be applied to the capacitor satisfactorily reaches a predetermined voltage. As a result, the amount of charge stored in the capacitor does not reach a predetermined value. To be specific, where an equivalent circuit diagram illustrating a memory cell of the first DRAM section 12 is the same as that illustrating a memory cell of the second DRAM section 13 illustrated in FIG. 14C, the voltage $V_D$ to be applied to the capacitor C does not reach a predetermined voltage, i.e., 1.0 V (for example, only a voltage of approximately 0.7 V is applied to the capacitor C). As a result, the amount of charge stored in the capacitor C only reaches approximately 30 fF×0.7V=21 fC, for example.

More specifically, when a signal (information) stored in a memory cell is determined to be high or low, the amount of stored charge different from the amount of charge representing real information only remains in the capacitor, leading to misoperation. If not only the operating voltage of the first DRAM section 12 but also the operating voltage of the second DRAM section 13 is increased to ensure the amount of charge stored in the first DRAM section 12, this would lead to increased power consumption for not only the first DRAM section 12 but also the second DRAM section 13 intended to store charge (hold a signal sufficiently long).

In view of the above, it is an object of the present invention to provide a DRAM-embedded device in which a CMOS logic section and a plurality of DRAM sections used for different applications are formed together on the same semiconductor substrate, and which realizes both reduced power consumption and increased processing speed while ensuring sufficient signal holding characteristic.

In order to achieve the above object, a semiconductor device of the present invention comprises: a first DRAM section formed on a semiconductor substrate and composed of a plurality of first memory cells; and a second DRAM section formed on the semiconductor substrate and composed of a plurality of second memory cells, wherein the operating speed of the first DRAM section is higher than that of the second DRAM section, and the capacitance of each said first memory cell is larger than that of each said second memory cell.

According to the semiconductor device of the present invention, the first DRAM section and the second DRAM section are provided on the same semiconductor substrate, and the capacitance of each first memory cell of the high-speed operating, first DRAM section is set to be larger than that of each said second memory cell of the low-speed operating, second DRAM section. Assuming that the operating voltage of the first DRAM section is the same as that of the second DRAM section, charge can sufficiently be stored in each said first memory cell even if the voltage applied to the first memory cell has not reached a predetermined voltage due to a high operating speed of the first DRAM section. The reason for this is that each said first memory cell has a large capacitance. For example, the amount of charge stored in a capacitor of the first memory cell can be made equal to the amount of charge stored in a capacitor of the second memory cell. Therefore, even if the first DRAM section is operated at a high speed, a signal stored in the first memory cell does not become an error signal. This can prevent misoperation from occurring and the first DRAM section can be operated at a high speed. Furthermore, as in a known DRAM-embedded device that will be described later, the operating voltage of the first DRAM section that needs to operate at high speed does not have to be increased, resulting in the reduced consumed power. On the other hand, in the second DRAM section, its low operating speed allows the voltage applied to the second memory cell to be increased sufficiently. This can provide a sufficient charge holding characteristic (signal holding charactersitic). Thus, a desired DRAM operation can be expected.

As described above, according to the semiconductor device of the present invention, a plurality of DRAM sections are composed of memory cells of a plurality of kinds having different capacitances. Thus, it is possible to realize a DRAM-embedded device that, even when a plurality of DRAM sections are mounted together with a CMOS logic section on the same chip, realizes both reduced power consumption and increased processing speed while ensuring sufficient signal holding characteristic, by optimizing the capacitance of the memory cell (accurately, a capacitive element (capacitor) located in the memory cell) of each DRAM section according to the application thereof.

On the other hand, for the known DRAM-embedded device, a plurality of DRAM sections with different operating speeds are provided on the same semiconductor substrate, and respective memory cells of all the DRAM sections are set to have equivalent capacitances. In this case, a lower voltage than the voltage to be applied to a capacitive element of each memory cell of a low-speed operating DRAM section is applied to a capacitive element of each memory cell of a high-speed operating DRAM section. The reason for this is that in the high-speed operating DRAM section, the next operation is accidentally started before a sufficient voltage is applied to the capacitive element. Therefore, only a charge smaller than a reference charge is stored in the capacitive element of each memory cell of the high-speed operating DRAM section. Furthermore, if the operating voltage of the high-speed operating DRAM section is set high to make up for such shortage of charge, another problem arises in which the consumed power increases.

According to the semiconductor device of the present invention, the operating voltage of the first DRAM section may be the same as that of the second DRAM section.

According to the semiconductor device of the present invention, the size of a capacitive element in each said first memory cell is preferably larger than that of a capacitive element in each said second memory cell.

Thus, the capacitance of each first memory cell can certainly be made larger than that of each second memory cell. To be specific, a capacitor lower electrode of each first memory cell may be provided to have a shape obtained by combining the shapes of respective capacitor lower electrodes of a plurality of second memory cells. In this case, even with the formation of a plurality of memory cell regions having different capacitance values on the same semiconductor substrate, as long as only the respective capacitor lower electrodes in the memory cell regions are designed to have different layouts while maintaining their standard shapes, the respective other members, e.g., contact plugs between the substrate and each capacitor lower electrode or impurity layers, located in the memory cell regions need not be designed to have different layouts. As a result, the region where a capacitive element of each first memory cell is formed can be made larger than the region where a capacitive element of each second memory cell is formed without complicating a semiconductor device fabricating process. Therefore, a first capacitance of each first memory cell can be made larger than a second capacitance of each second memory cell. Thus, the above-mentioned effects of the semiconductor device of the present invention can certainly be obtained.

According to the semiconductor device of the present invention, a capacitive element for each said first memory cell preferably has a configuration obtained by combining two or more capacitive elements each for each said second memory cell.

This can make the capacitance of each first memory cell larger than that of each second memory cell.

In this case, a lower electrode of the capacitive element in each said second memory cell may be electrically connected through a corresponding plug to the semiconductor substrate, and a lower electrode of the capacitive element in each said first memory cell may be composed of a plurality of adjacent electrode parts each having the same configuration as the lower electrode of the second memory cell, said plurality of electrode parts being electrically connected through a common plug to the semiconductor substrate. Thus, even with the formation of a plurality of memory cell regions having different capacitance values on the same semiconductor substrate, as long as only respective plugs located in the memory cell regions are designed to have different layouts, the respective other members, e.g., capacitor lower electrodes or impurity layers, located in the memory cell regions need not be designed to have different layouts. As a result, the region where a capacitive element of each first memory cell is formed can be made larger than the region where a capacitive element of each second memory cell is formed without designing a new layout and complicating a semiconductor device fabricating process. Therefore, a first capacitance of each first memory cell can be made larger than a second capacitance of each second memory cell. Thus, the above-mentioned effects of the semiconductor device of the present invention can certainly be obtained.

In this case, a lower electrode of the capacitive element in each said second memory cell may be electrically connected through a corresponding plug to a corresponding impurity layer in the semiconductor substrate, and a lower electrode of the capacitive element in each said first memory cell may be composed of a plurality of adjacent electrode parts each having the same configuration as the lower electrode of the second memory cell, said plurality of electrode parts being electrically connected through individual plugs to a common impurity layer in the semiconductor substrate. Thus, even with the formation of a plurality of memory cell regions having different capacitance values on the same semiconductor substrate, as long as only respective impurity layers located in the memory cell regions are designed to have different layouts, the respective other members, e.g., capacitor lower electrodes or plugs, located in the memory cell regions need not be designed to have different layouts. As a result, the region where a capacitive element of each first memory cell is formed can be made larger than the region where a capacitive element of each second memory cell is formed without designing a new layout and complicating a semiconductor device fabricating process. Therefore, a first capacitance of each first memory cell can be made larger than a second capacitance of each second memory cell. Thus, the above-mentioned effects of the semiconductor device of the present invention can certainly be obtained.

A method for fabricating a semiconductor device of a first aspect of the present invention comprises the steps of: forming interlayer insulating films on parts of a semiconductor substrate located in a first memory region and a second memory region, respectively; forming a first plug in the interlayer insulating film located in the first memory region to allow electrical connection with the semiconductor substrate and forming a second plug in the interlayer insulating film located in the second memory region to allow electrical connection with the semiconductor substrate; forming a second capacitor lower electrode on the interlayer insulating film located in the second memory region to allow electrical connection with the second plug and forming a first capacitor lower electrode on the interlayer insulating film located in the first memory region to allow electrical connection with the first plug and become larger than the second capacitor lower electrode; and successively forming a capacitor insulating film and a capacitor upper electrode on each of the first and second capacitor lower electrodes, thereby forming a first capacitive element and a second capacitive element on the interlayer insulating films located on the first memory region and the second memory region, respectively.

According to the method for fabricating the semiconductor device of a first aspect, capacitive elements are formed over the same semiconductor substrate located in the first memory region and the second memory region, respectively, and the capacitive elements located in the first memory region and the second memory region are different from each other only in the configurations of their capacitor lower electrodes. To be specific, for example, each capacitor lower electrode located in the first memory region is provided to have a shape obtained by combining two or more of a plurality of capacitor lower electrodes for the second memory region. Thus, the first capacitor lower electrode is made larger than the second capacitor lower electrode. Therefore, the capacitance of each first capacitive element located in the first memory region can be made larger than that of each second capacitive element located in the second memory region. In view of the above, also when a DRAM section composed of memory cells each having a first capacitive element is formed in the first memory region and the DRAM section is operated at a high speed (in other words, voltage is applied to the DRAM section at a high speed), charge can sufficiently be stored in a memory cell of the DRAM section without increasing the operating voltage of the DRAM section. More particularly, since a signal stored in the memory cell having the first capacitive element does not become an error signal, this can prevent misoperation from occurring and the DRAM section can be operated at a high speed. In addition, since the operating voltage of the DRAM section does not have to be increased, this can reduce consumed power. On the other hand, when a DRAM section composed of memory cells each having a second capacitive element is formed in the second memory region, the low-speed operation of this DRAM section allows sufficient increase in the voltage applied to each memory cell having a second capacitive element. This can provide a sufficient charge holding characteristic (signal holding characteristic). Thus, a desired DRAM operation can be expected.

As described above, since in the method for fabricating a semiconductor device of the first aspect a plurality of DRAM sections are composed of capacitive elements of a plurality of kinds having different capacitances, a DRAM-embedded device in which a plurality of DRAM sections are mounted together with the CMOS logic section on the same chip can achieve both reduced power consumption and increased processing speed while ensuring sufficient signal holding characteristic, by optimizing the capacitance of the capacitive element for each DRAM section according to the application thereof.

A method for fabricating a semiconductor device of a second aspect of the present invention comprises the steps of: forming interlayer insulating films on parts of a semiconductor substrate located in a first memory region and a second memory region, respectively; forming a first plug in the interlayer insulating film located in the first memory region to allow electrical connection with the semiconductor substrate and forming a second plug in the interlayer insulating film located in the second memory region to allow electrical connection with the semiconductor substrate; forming a second capacitor lower electrode on the interlayer insulating film located in the second memory region to allow electrical connection with the second plug and forming a first capacitor lower electrode on the interlayer insulating film located in the first memory region, said first capacitor lower electrode being composed of a plurality of electrode parts each having the same configuration as the second capacitor lower electrode and each allowing electrical connection with the first plug; and successively forming a capacitor insulating film and a capacitor upper electrode on each of the first and second capacitor lower electrodes, thereby forming a first capacitive element and a second capacitive element on the interlayer insulating films located on the first memory region and the second memory region, respectively, wherein the plurality of electrode parts are connected to the first plug.

According to the method for fabricating a semiconductor device of the second aspect, when capacitive elements are formed over the same semiconductor substrate located in the first memory region and the second memory region, respectively, capacitive elements each having a configuration obtained by combining two or more of capacitive elements for the second memory region are formed in the first memory region. To be specific, capacitor lower electrodes (first capacitor lower electrodes) each composed of a plurality of electrode parts each having the same configuration as each capacitor lower electrode (second capacitor lower electrode) located in the second memory region are formed in the first memory region, and the plurality of electrode parts are connected to a common plug (first plug). More particularly, while a second capacitor lower electrode is electrically connected through a corresponding plug (second plug) to the semiconductor substrate, the plurality of electrode parts of the first capacitor lower electrode are electrically connected through the first plug that is larger than each second plug to the semiconductor substrate. Thus, as long as only respective plugs located in memory cell regions are designed to have different layouts, the respective other members, e.g., capacitor lower electrodes or impurity layers, located in the memory regions need not be designed to have different layouts. As a result, the capacitance of each first capacitive element located in the first memory region can be made larger than that of each second capacitive element located in the second memory region without complicating a semiconductor device fabricating process. In view of the above, also when a DRAM section composed of memory cells each having a first capacitive element is formed in the first memory region and the DRAM section is operated at a high speed (in other words, voltage is applied to the DRAM section at a high speed), charge can sufficiently be stored in a memory cell of the DRAM section without increasing the operating voltage of the DRAM section. More particularly, since a signal stored in the memory cell having the first capacitive element does not become an error signal, this can prevent misoperation from occurring and the DRAM section can be operated at a high speed. In addition, since the operating voltage of the DRAM section does not have to be increased, this can reduce consumed power. On the other hand, when a DRAM section composed of memory cells each having a second capacitive element is formed in the second memory region, the low-speed operation of this DRAM section allows sufficient increase in the voltage applied to each memory cell having a second capacitive element. This can provide a sufficient charge holding characteristic (signal holding characteristic). Thus, a desired DRAM operation can be expected.

As described above, since in the method for fabricating a semiconductor device of the second aspect a plurality of DRAM sections are composed of capacitive elements of a plurality of kinds having different capacitances, a DRAM-embedded device in which a plurality of DRAM sections are mounted together with the CMOS logic section on the same chip can achieve both reduced power consumption and increased processing speed while ensuring sufficient signal holding characteristic, by optimizing the capacitance of the capacitive element for each DRAM section according to the application thereof.

A method for fabricating a semiconductor device of a third aspect of the present invention comprises the steps of: forming a first impurity layer in a part of a semiconductor substrate located in a first memory region and forming a second impurity layer in a part of a semiconductor substrate located in a second memory region; forming interlayer insulating films on parts of the semiconductor substrate in which the first and second impurity layers are formed, said parts of the semiconductor substrate being located in the first and second memory regions, respectively; forming a plurality of first plugs in the interlayer insulating film located in the first memory region to allow electrical connection with the first impurity layer and forming a second plug in the interlayer insulating film located in the second memory region to allow electrical connection with the second impurity layer; forming a second capacitor lower electrode on the interlayer insulating film located in the second memory region to allow electrical connection with the second plug and forming a first capacitor lower electrode on the interlayer insulating film located in the first memory region, said first capacitor lower electrode being composed of a plurality of electrode parts each having the same configuration as the second capacitor lower electrode and allowing electrical connection with the plurality of first plugs, respectively; and successively forming a capacitor insulating film and a capacitor upper electrode on each of the first and second capacitor lower electrodes, thereby forming a first capacitive element and a second capacitive element on the interlayer insulating films located on the first memory region and the second memory region, respectively, wherein the electrode parts are electrically connected through the first plugs, respectively, to the first impurity layer.

According to the method for fabricating a semiconductor device of the third aspect, when capacitive elements are formed over the same semiconductor substrate located in the first memory region and the second memory region, respectively, capacitive elements each having a configuration obtained by combining two or more of the capacitive elements for the second memory region are formed in the first memory region. To be specific, capacitor lower electrodes (first capacitor lower electrodes) each composed of a plurality of electrode parts each having the same configuration as each capacitor lower electrode (second capacitor lower electrode) located in the second memory region are formed in the first memory region, and the plurality of electrode parts are electrically connected through individual plugs (a plurality of first plugs) to the same impurity layer (first impurity layer). More particularly, while a second capacitor lower electrode is electrically connected through a corresponding plug (second plug) to a corresponding impurity layer (second impurity layer), the plurality of electrode parts of the first capacitor lower electrode are electrically connected through individual first plugs to the first impurity layer that is larger than the second impurity layer. Thus, as long as only respective impurity layers located in memory cell regions are designed to have different layouts, the respective other members, e.g., capacitor lower electrodes or plugs, located in the memory regions need not be designed to have different layouts. As a result, the capacitance of each first capacitive element located in the first memory region can be made larger than that of each second capacitive element located in the second memory region without complicating a semiconductor device fabricating process. In view of the above, also when a DRAM section composed of memory cells each having a first capacitive element is formed in the first memory region and the DRAM section is operated at a high speed (in other words, voltage is applied to the DRAM section at a high speed), charge can sufficiently be stored in a memory cell of the DRAM section without increasing the operating voltage of the DRAM section. More particularly, since a signal stored in the memory cell having the first capacitive element does not become an error signal, this can prevent misoperation from occurring and the DRAM section can be operated at a high speed. In addition, since the operating voltage of the DRAM section does not have to be increased, this can reduce consumed power. On the other hand, when a DRAM section composed of memory cells each having a second capacitive element is formed in the second memory region, the low-speed operation of this DRAM section allows sufficient increase in the voltage applied to each memory cell having a second capacitive element. This can provide a sufficient charge holding characteristic (signal holding characteristic). Thus, a desired DRAM operation can be expected.

As described above, since in the method for fabricating a semiconductor device of the third aspect a plurality of DRAM sections are composed of capacitive elements of a plurality of kinds having different capacitances, a DRAM-embedded device in which a plurality of DRAM sections are mounted together with the CMOS logic section on the same chip can achieve both reduced power consumption and increased processing speed while ensuring sufficient signal holding characteristic, by optimizing the capacitance of the capacitive element for each DRAM section according to the application thereof.

The present invention relates to a DRAM-embedded system LSI. When this DRAM-embedded system LSI is applied to a semiconductor device in which a plurality of DRAM sections used for different applications are mounted together with a CMOS logic section on the same semiconductor substrate, this semiconductor device can provide reduced power consumption and increased processing speed while ensuring sufficient signal holding characteristic. Therefore, the present invention is very useful.

DETAILED DESCRIPTION OF THE INVENTION

Embodiment 1

A semiconductor device according to a first embodiment of the present invention will now be described with reference to the drawings.

Figure 1A:
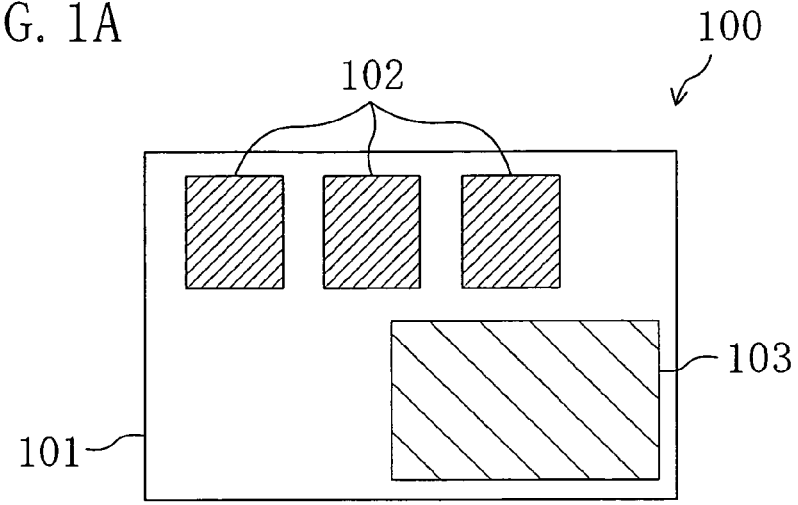
FIG. 1A is a plan view illustrating a general configuration of a semiconductor device according to a first embodiment of the present invention.

FIG. 1A is a plan view illustrating a general configuration of the semiconductor device according to the first embodiment of the present invention.

As illustrated in FIG. 1A, a CMOS logic section 101 is formed on a chip 100, and a first DRAM section 102 and a second DRAM section 103 are formed on the same chip 100. The first DRAM section 102 is intended to provide temporary storage of data being processed at a high speed, i.e., to store a charge that is moved at a high speed. In contrast, the second DRAM section 103 is intended to hold a signal written thereto sufficiently long (for example, at an operating temperature of approximately 85 through 100° C. for approximately a few hundreds or more of msec).

A feature of the present embodiment is that the capacitances of the memory cells of the first DRAM section 102 and the second DRAM section 103 are individually set at different values for their respective applications. To be specific, the capacitance of each memory cell of the first DRAM section 102 having a higher operating speed than the second DRAM section 103 is set to be larger than the capacitance of each memory cell of the second DRAM section 103.

Figure 1B:
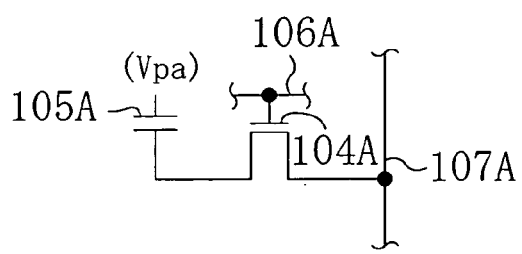
FIG. 1B and FIG. 1C are equivalent circuit diagrams illustrating memory cells of a first DRAM section and a second DRAM section, respectively, illustrated in FIG. 1A, and FIG. 1D and FIG. 1E are graphs illustrating the charge storing characteristics of cell capacitors of the first DRAM section and the second DRAM section, respectively, illustrated in FIG. 1A.
Figure 1C:
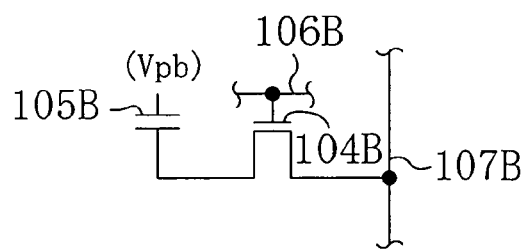

FIG. 1B is an equivalent circuit diagram illustrating a memory cell of the first DRAM section 102 illustrated in FIG. 1A, and FIG. 1C is an equivalent circuit diagram illustrating a memory cell of the second DRAM section 103 illustrated in FIG. 1A.

As illustrated in FIG. 1B, each memory cell of the first DRAM section 102 includes a first transfer transistor 104A and a first capacitor (capacitive element) 105A. One of electrodes of a first capacitor 105A is connected through the first transfer transistor 104A to a first bit line 107A, and a plate voltage $V_{pa}$ is applied to the other electrode of the first capacitor 105A. The gate electrode of the first transfer transistor 104A is connected to a first word line 106A. It is assumed that the capacitance of the first capacitor 105A is $C_a$, the power supply voltage of the first capacitor 105A is $V_{DDa}$ (in this embodiment, $V_{Pa}=\frac{1}{2}\cdot V_{DDa}$) and the charge stored in the first capacitor 105A is $Q_a$.

On the other hand, as illustrated in FIG. 1C, each memory cell of the second DRAM section 103 includes a second transfer transistor 104B and a second capacitor (capacitive element) 105B. One of electrodes of the second capacitor 105B is connected through the second transfer transistor 104B to a second bit line 107B, and a plate voltage $V_{pb}$ is applied to the other electrode of the second capacitor 105B. The gate electrode of the second transfer transistor 104B is connected to a second word line 106B. It is assumed that the capacitance of the second capacitor 105B is $C_b$, the power supply voltage of the second capacitor 105B is $V_{DDb}$ (in this embodiment, $V_{Pb}=\frac{1}{2}\cdot V_{DDb}$) and the charge stored in the second capacitor 105B is $Q_b$.

Subsequently, the charge storing characteristics of the first capacitor 105A illustrated in FIG. 1B and the second capacitor 105B illustrated in FIG. 1C will now be described.

Figure 1D:
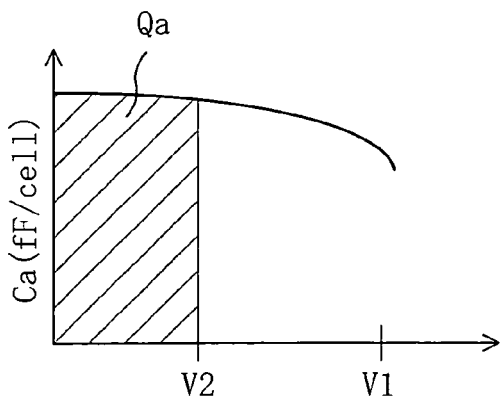

FIG. 1D is a graph illustrating the relationship between the capacitance $C_a$ of the first capacitor 105A illustrated in FIG. 1B and the operating voltage ($=V_{DDa}-V_{Pa}$) applied between the electrodes of the first capacitor 105A.

Figure 1E:
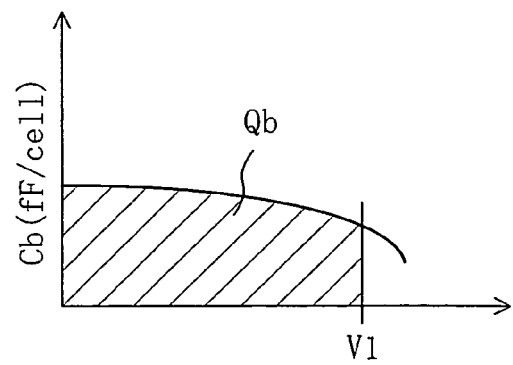

FIG. 1E is a graph illustrating the relationship between the capacitance $C_b$ of the second capacitor 105B illustrated in FIG. 1C and the operating voltage ($=V_{DDb}-V_{Pb}$) applied between the electrodes of the second capacitor 105B.

To be specific, for example, $C_a=15$ fF and $(V_{DDa}-V_{Pa})=V1=0.75$ V for the first capacitor 105A of the first DRAM section 102, whereas $C_b=10$ fF and $(V_{DDb}-V_{Pb})=V1=0.75$ V for the second capacitor 105B of the second DRAM section 103.

In this embodiment, it is assumed that, for example, the operating speed of the first DRAM section 102 is 100 or more MHz (more specifically, approximately a few hundreds of MHz) and the operating speed of the second DRAM section 103 is less than 100 MHz (more specifically, approximately a few tens of MHz). When there exists the difference of the operating speed between the DRAM sections 102 and 103 as described above, a voltage applied to the second capacitor 105B of the second DRAM section 103 having a low operating speed is sufficiently increased to reach V1. On the other hand, a voltage applied to the first capacitor 105A of the first DRAM section 102 having a high operating speed is not increased to reach V1 but reaches only a lower value than V1, for example, approximately $V2=0.5$ V.

The amount of charge stored in the first and second capacitors 105A and 105B can be represented as a physical quantity whose value is equal to the area of the hatched portion in FIG. 1D and FIG. 1E. Therefore, the amount of charge $Q_a$ stored in the first capacitor 105A is 7.5 fC based on Expression (2) below.

$$Q_a = C_a \cdot V2 = 15 fF \cdot 0.5 V = 7.5 fC \qquad (2)$$

On the other hand, the amount of charge $Q_b$ stored in the second capacitor 105B is 7.5 fC based on Expression (3) below.

$$Q_b = C_b \cdot V1 = 10 fF \cdot 0.75 V = 7.5 fC \qquad (3)$$

As described above, in this embodiment, the amount of charge $Q_a$ stored in the first capacitor 105A can be set to be substantially the same as that of charge $Q_b$ stored in the second capacitor 105B. This allows both the first DRAM section 102 having a high operating speed and the second DRAM section 103 having a low operating speed to store enough charge in the respective capacitors in operating the DRAMs. Therefore, for example, a signal stored in a memory cell can be determined to be high or low without misoperation. In other words, even when the first DRAM section 102 and the second DRAM section 103 are operated at the same voltage, both the first DRAM section 102 for operating at a high speed and the second DRAM section 103 for operating at a low speed with the aim of charge retention can be operated properly. Furthermore, the operating voltage of the first DRAM section 102 that needs to operate at a high speed does not have to be increased, resulting in the reduced consumed power.

Thus, it is possible to realize a DRAM-embedded device that realizes both a reduced power consumption and an increased processing speed while ensuring a sufficient signal holding characteristic, by optimizing the capacitance of the memory cell for each DRAM section according to the application thereof, as in the present embodiment.

Meanwhile, where in the present embodiment Ca=Cb=10fF as in the known semiconductor device, the amount of charge stored in the first capacitor 105A is calculated in the following manner: 10fF×0.5 V=5.0 fC. This value becomes smaller than the aforementioned $Q_a$, i.e., 7.5 fC, by 2 or more fC.

In the first embodiment, the capacitance of each of the first and second capacitors 105A and 105B and the operating speed of each of the first and second DRAM sections 102 and 103 can arbitrarily be determined within a certain range according to the purpose of the associated DRAM section. In this relation, the capacitance Ca of the memory cell (first capacitor 105A) of the first DRAM section 102 having a higher operating speed than the second DRAM section 103 need be set to be larger than the capacitance Cb of the memory cell (second capacitor 105B) of the second DRAM section 103.

Although in the first embodiment the first DRAM section 102 and the second DRAM section 103 are set to have the same operating voltage, they may be set to have different operating voltages.

Embodiment 2

A semiconductor device and a method for fabricating the same according to the second embodiment of the present invention will now be described with reference to the drawings.

Figure 2A:
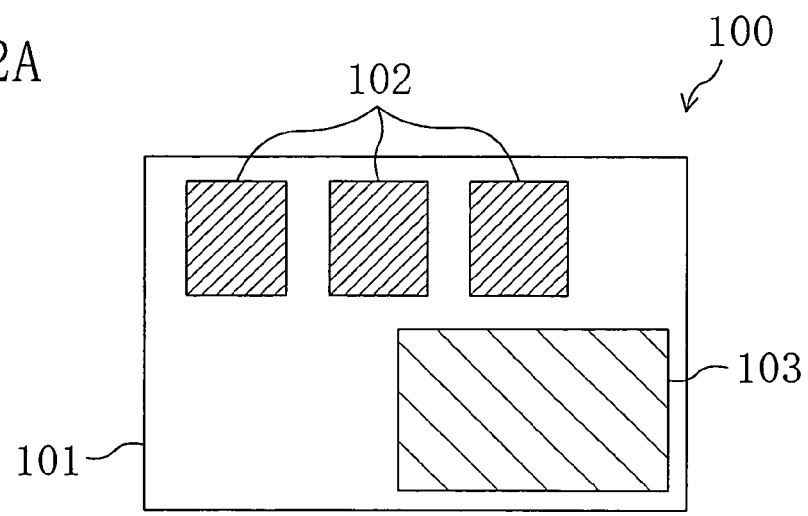
FIG. 2A is a plan view illustrating a general configuration of a semiconductor device according to a second embodiment of the present invention.

FIG. 2A is a plan view illustrating a general configuration of the semiconductor device according to the second embodiment of the present invention.

Like the first embodiment illustrated in FIG. 1A, as illustrated in FIG. 2A, a CMOS logic section 101 is formed on a chip 100, and a first DRAM section 102 and a second DRAM section 103 are formed on the same chip 100. The first DRAM section 102 is intended to provide temporary storage of data being processed at a high speed, i.e., to store a charge that is moved at a high speed. In contrast, the second DRAM section 103 is intended to hold a signal written thereto sufficiently long (for example, at an operating temperature of approximately 85 through 100° C. for approximately a few hundreds or more of msec).

Figure 2B:
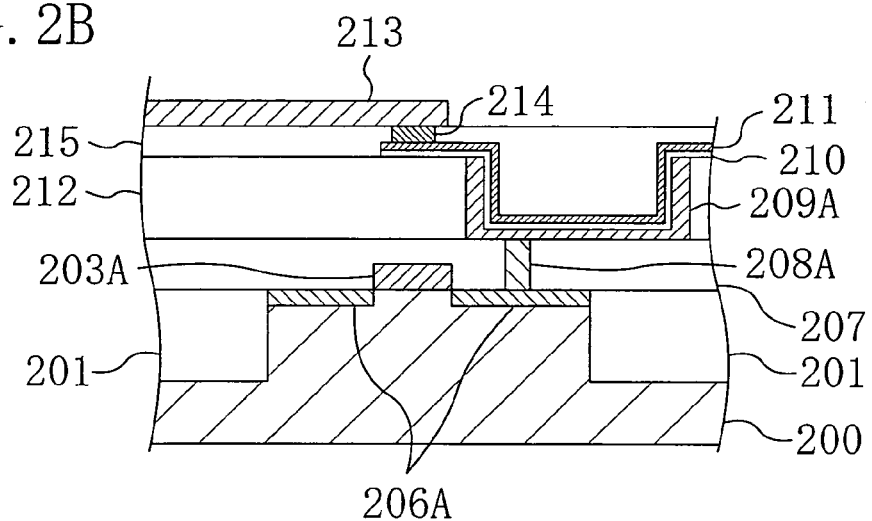
FIG. 2B is a cross-sectional view illustrating the configuration of a memory cell in a first memory region $R_A$ in which the first DRAM section is formed as illustrated in FIG. 2A.
Figure 2C:
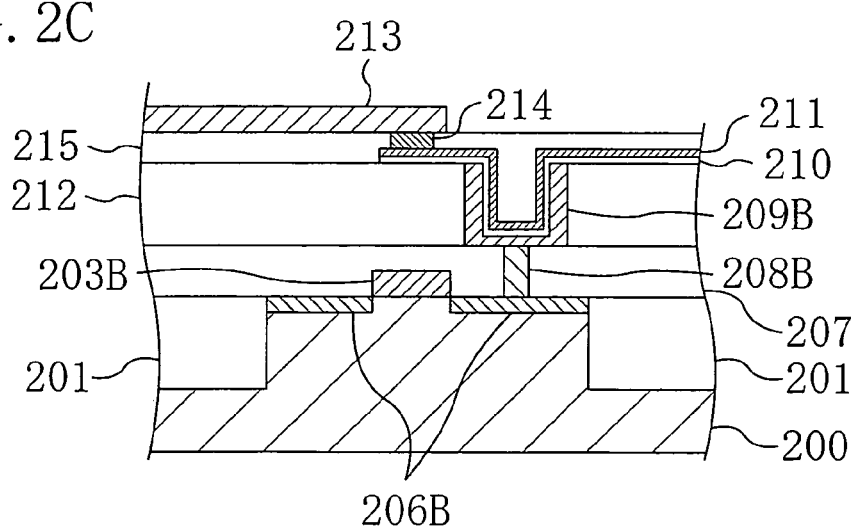
FIG. 2C is a cross-sectional view illustrating the configuration of a memory cell in a second memory region $R_B$ in which the second DRAM section is formed as illustrated in FIG. 2A.

FIG. 2B is a cross-sectional view illustrating the configuration of a memory cell in a first memory region ($R_A$) on which the first DRAM section 102 is formed as illustrated in FIG. 2A, and FIG. 2C is a cross-sectional view illustrating the configuration of a memory cell in a second memory region ($R_B$) in which the second DRAM section 103 is formed as illustrated in FIG. 2A.

As illustrated in FIG. 2B, a first gate electrode 203A is formed on an element region of a semiconductor substrate 200 surrounded by an isolation 201 in the first memory region $R_A$ with a gate insulating film (unshown) interposed between the first gate electrode 203A and the semiconductor substrate 200. A first impurity diffusion layer 206A is formed in the element region so as to be placed at both sides of the first gate electrode 203A. Thus, a transfer transistor for the first memory region $R_A$ is formed of the first gate electrode 203A and the first impurity diffusion layer 206A.

Meanwhile, as illustrated in FIG. 2C, a second gate electrode 203B is formed on an element region of the semiconductor substrate 200 surrounded by an isolation 201 in the second memory region $R_B$ with a gate insulating film (unshown) interposed between the second gate electrode 203B and the semiconductor substrate 200. A second impurity diffusion layer 206B is formed in the element region so as to be placed at both sides of the second gate electrode 203B. Thus, a transfer transistor for the second memory region $R_B$ is formed of the second gate electrode 203B and the second impurity diffusion layer 206B.

Furthermore, as illustrated in FIGS. 2B and 2C, a first interlayer insulating film 207 is formed on the semiconductor substrate 200 on which the gate electrodes 203A and 203B are formed. A first contact plug 208A is formed in a part of the first interlayer insulating film 207 located in the first memory region $R_A$ to allow connection with the first impurity diffusion layer 206A, and a second contact plug 208B is formed in a part of the first interlayer insulating film 207 located in the second memory region $R_B$ to allow connection with the second impurity diffusion layer 206B.

Furthermore, as illustrated in FIGS. 2B and 2C, a second interlayer insulating film 212 is formed on the first interlayer insulating film 207 in which the contact plugs 208A and 208B are embedded. In this relation, a trench for the formation of a capacitor is formed in a part of the second interlayer insulating film 212 located in the first memory region $R_A$ to reach the first contact plug 208A, and a trench for the formation of a capacitor is formed in a part of the second interlayer insulating film 212 located in the second memory region $R_B$ to reach the second contact plug 208B. A first capacitor lower electrode 209A is formed to cover the bottom and wall surfaces of the trench for the formation of a capacitor in the first memory region $R_A$ and allow electrical connection with the first contact plug 208A. Furthermore, a second capacitor lower electrode 209B is formed to cover the bottom and wall surfaces of the trench for the formation of a capacitor in the second memory region $R_B$ and allow electrical connection with the second contact plug 208B.

Figure 3:
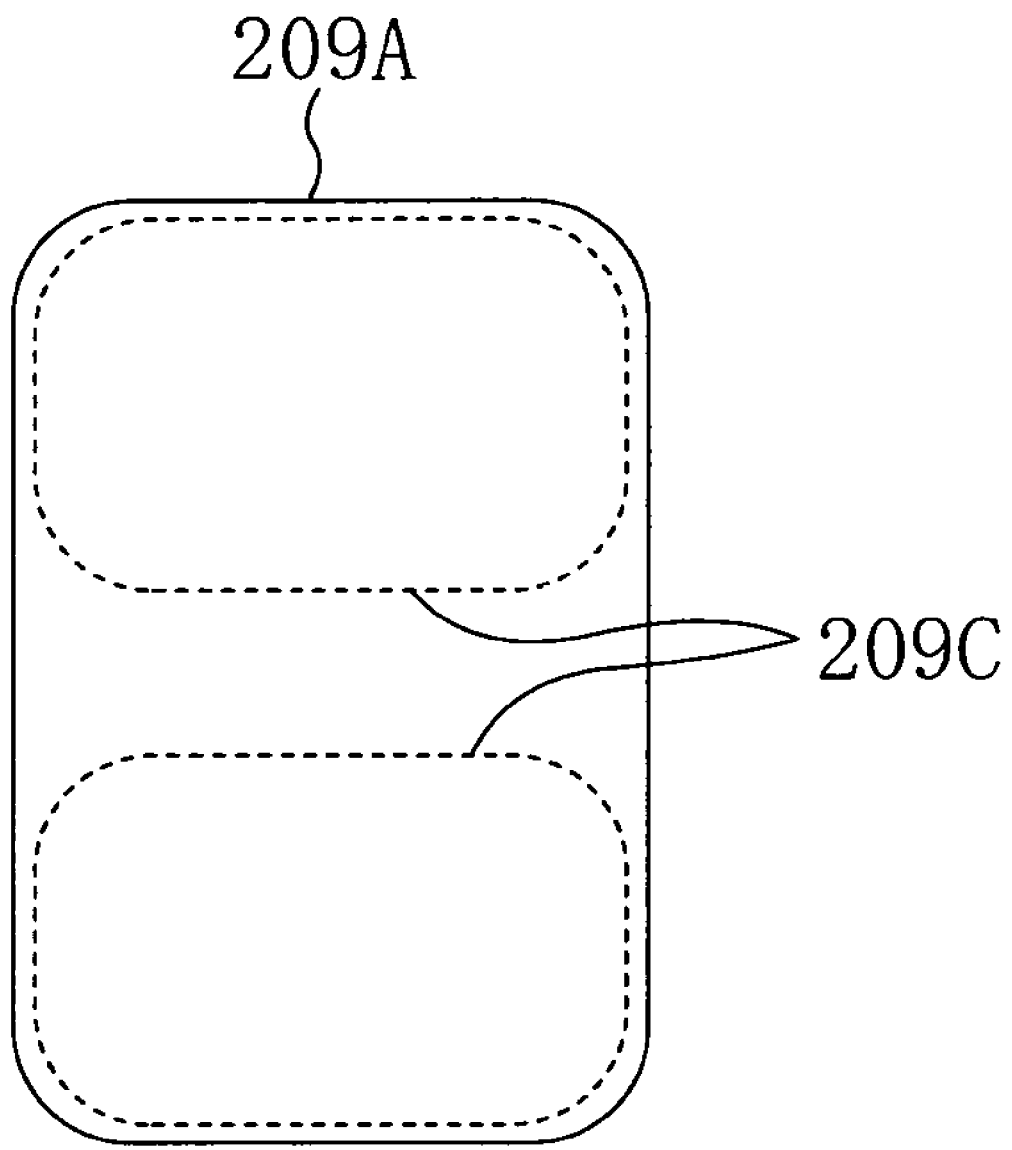
FIG. 3 is a diagram illustrating the shape of a first capacitor lower electrode formed in the first memory region $R_A$ of a semiconductor device according to the second embodiment of the present invention.

A feature of the present embodiment is that the first capacitor lower electrode 209A formed in the first memory region $R_A$ has a larger area than the second capacitor lower electrode 209B formed in the second memory region $R_B$. To be specific, as illustrated in FIG. 3, the first capacitor lower electrode 209A may be provided to have a shape obtained by combining two virtual electrode parts 209C each having the same shape as the second capacitor lower electrode 209B.

Furthermore, as illustrated in FIGS. 2B and 2C, a capacitor insulating film 210 is formed to cover the first capacitor lower electrode 209A and the second capacitor lower electrode 209B, and a capacitor upper electrode 211 is formed to cover the capacitor insulating film 210. Thus, a cell capacitor of the first DRAM section 102 is formed in the first memory region $R_A$, and a cell capacitor of the second DRAM section 103 is formed in the second memory region $R_B$. Although not shown, cell capacitors (i.e., memory cells) are arranged in matrix form in each memory region $R_A$ and $R_B$.

Furthermore, as illustrated in FIGS. 2B and 2C, a third interlayer insulating film 215 is formed on the entire surfaces of the respective cell capacitors located in the memory regions $R_A$ and $R_B$ and the top surface of the second interlayer insulating film 212. A plurality of plugs 214 are formed in the third interlayer insulating film 215 to allow electrical connection with the respective cell capacitors (actually, the capacitor upper electrodes 211) located in the memory regions $R_A$ and $R_B$. A wiring layer 213 is formed on the third interlayer insulating film 215 to allow electrical connection with the plugs 214.

Next, a method for fabricating the semiconductor device according to the second embodiment, more specifically, a method for fabricating the semiconductor device illustrated in FIGS. 2B and 2C, will be described with reference to the drawings.

FIGS. 4A through 4E are cross-sectional views illustrating steps in the method for fabricating the semiconductor device according to the second embodiment. Note that in FIGS. 4A through 4E, the same members as those of the semiconductor device of the second embodiment illustrated in FIGS. 2B and 2C will be denoted by the same reference numerals.

Figure 4A:
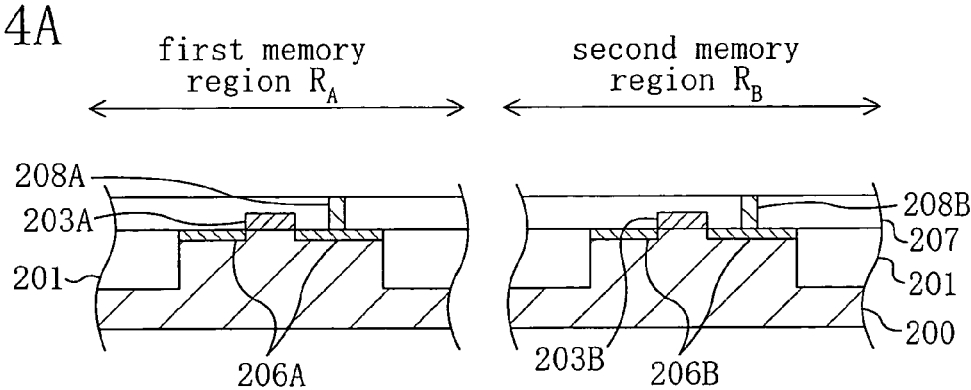
FIGS. 4A through 4E are cross-sectional views illustrating steps in a method for fabricating the semiconductor device according to the second embodiment of the present invention.

First, as illustrated in FIG. 4A, a first gate electrode 203A is formed on a memory cell formation region of a semiconductor substrate 200 surrounded by an isolation 201 in a first memory region $R_A$ with a gate insulating film (unshown) interposed between the first gate electrode 203A and the semiconductor substrate 200. A second gate electrode 203B is formed on a memory cell formation region of the semiconductor substrate 200 surrounded by the isolation 201 in a second memory region $R_B$ with a gate insulating film (unshown) interposed between the second gate electrode 203B and the semiconductor substrate 200. Next, impurities are implanted into parts of the semiconductor substrate 200 located at both sides of the first and second electrodes 203A and 203B, thereby forming a first impurity diffusion layer 206A and a second impurity diffusion layer 206B. Then, a first interlayer insulating film 207 is deposited across the entire surface of the semiconductor substrate 200, and thereafter contact holes reaching the first impurity diffusion layer 206A and the second impurity diffusion layer 206B, respectively, are formed, by photolithography and etching, in parts of the first interlayer insulating film 207 located in the first memory region $R_A$ and the second memory region $R_B$. Then, a conductive film is formed across the entire surface of the semiconductor substrate 200 to completely fill each contact hole. Then, an unnecessary portion of the conductive film located outside each contact hole is removed, thereby forming a first contact plug 208A electrically connected to the first impurity diffusion layer 206A and a second contact plug 208B electrically connected to the second impurity diffusion layer 206B.

Figure 4B:
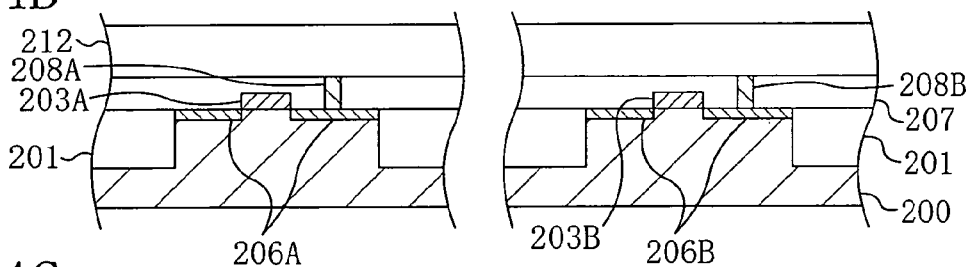
Figure 4C:
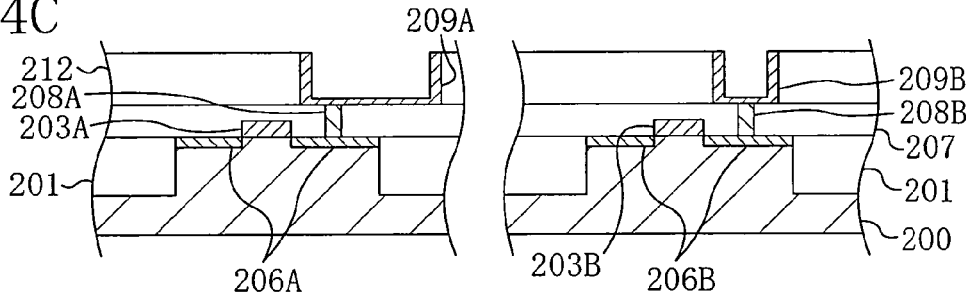

Next, as illustrated in FIG. 4B, a second interlayer insulating film 212 is deposited across the entire surface of the semiconductor substrate 200. Then, as illustrated in FIG. 4C, a trench for the formation of a capacitor is formed in a part of the second interlayer insulating film 212 located in the first memory region $R_A$ to reach the first contact plug 208A. In addition, a trench for the formation of a capacitor is formed in a part of the second interlayer insulating film 212 located in the second memory region $R_B$ to reach the second contact plug 208B. Subsequently, a first capacitor lower electrode 209A is formed to cover the bottom and wall surfaces of the trench for the formation of a capacitor in the first memory region $R_A$, and a second capacitor lower electrode 209B is formed to cover the bottom and wall surfaces of the trench for the formation of a capacitor in the second memory region $R_B$. In the present embodiment, the capacitor lower electrodes 209A and 209B are made of phosphorus-containing silicon, for example. Furthermore, as described above, a feature of the present embodiment is that a region where the first capacitor lower electrode 209A is formed has a larger area than a region where the second capacitor lower electrode 209B is formed. In other words, in the present embodiment, the first memory region $R_A$ and the second memory region $R_B$ are different from each other in the layouts of masks used in a process step of patterning the second interlayer insulating film 212 to form trenches for the formation of capacitors in the memory regions $R_A$ and $R_B$, respectively.

Figure 4D:
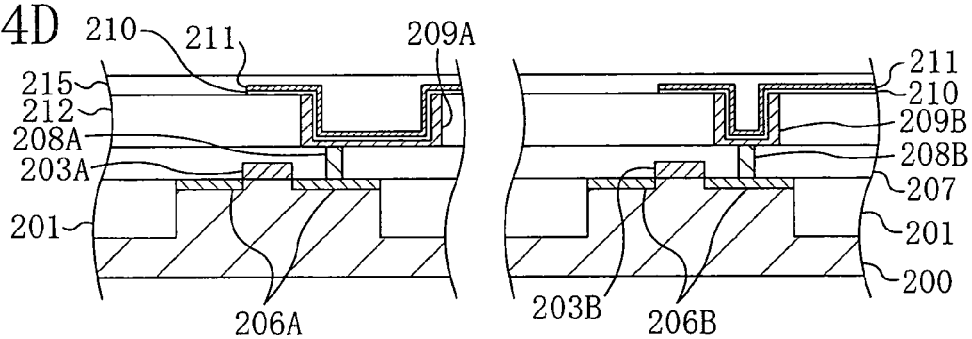

Next, as illustrated in FIG. 4D, capacitor insulating films 210, which are layered films of a silicon oxide film and a silicon nitride film (ON films), for example, are formed to cover the first capacitor lower electrode 209A and the second capacitor lower electrode 209B, respectively. Then, capacitor upper electrodes 211 made of phosphorus-containing silicon, for example, are formed to cover the capacitor insulating films 210, respectively. Thus, a cell capacitor of the first DRAM section 102 is formed in the first memory region $R_A$, and a cell capacitor of the second DRAM section 103 is formed in the second memory region $R_B$.

Figure 4E:
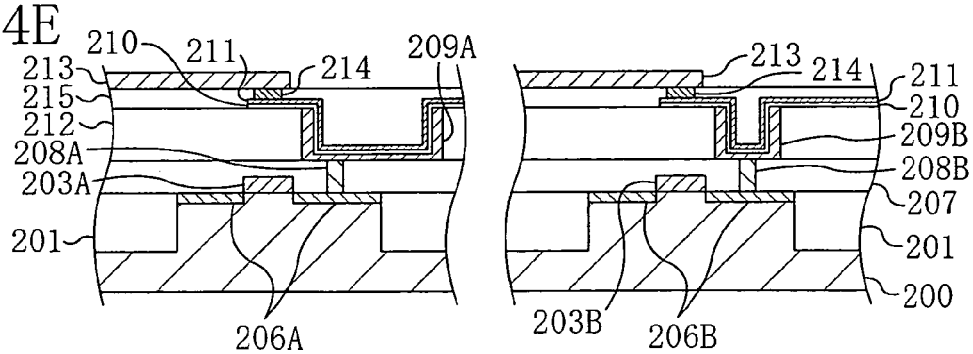

Thereafter, a third interlayer insulating film 215 is formed across the entire surface of the semiconductor substrate 200. Then, as illustrated in FIG. 4E, a plurality of plugs 214 are formed in the third interlayer insulating film 215 to allow electrical connection with the capacitor upper electrodes 211 in both the memory regions $R_A$ and $R_B$. Then, a wiring layer 213 is formed on the third interlayer insulating film 215 to allow electrical connection with the plugs 214. With the above process steps, the first DRAM section 102 and the second DRAM section 103 are formed in the first memory region $R_A$ and the second memory region $R_B$, respectively.

As described above, according to the second embodiment, cell capacitors are formed on parts of the semiconductor substrate 200 located in the first memory region $R_A$ and the second memory region $R_B$, and the cell capacitors located in the first memory region $R_A$ are different from those located in the second memory region $R_B$ in the structures of the capacitor lower electrodes 209. To be specific, for example, the first capacitor lower electrode 209A located in the first memory region $R_A$ is provided to have a shape obtained by combining the shapes of a plurality of second capacitor lower electrodes 209B located in the second memory region $R_B$. Thus, the first capacitor lower electrode 209A is made larger than the second capacitor lower electrode 209B. Therefore, the cell capacitance of the cell capacitor located in the first memory region $R_A$ can be made larger than that of the cell capacitor located in the second memory region $R_B$. In view of the above, also when the first DRAM section 102 composed of memory cells each having a large capacitance is formed in the first memory region $R_A$ and the first DRAM section 102 is operated at a high speed, charge can sufficiently be stored in a memory cell of the first DRAM section 102 without increasing the operating voltage of the first DRAM section 102. More particularly, since a signal stored in a memory cell of the first DRAM section 102 does not become an error signal, this can prevent misoperation from occurring and the first DRAM section 102 can be operated at a high speed. In addition, since the operating voltage of the first DRAM section 102 does not have to be increased, this can reduce consumed power. On the other hand, when the second DRAM section 103 composed of memory cells each having a small capacitance is formed in the second memory region $R_B$, the low-speed operation of the second DRAM section 103 allows sufficient increase in the voltage applied to each memory cell thereof. This can provide a sufficient charge holding characteristic (signal holding characteristic). Thus, a desired DRAM operation can be expected.

In summary, since in the present embodiment a plurality of DRAM sections are composed of cell capacitors of a plurality of kinds having different capacitances, a DRAM-embedded device in which a plurality of DRAM sections are mounted together with the CMOS logic section on the same chip can achieve both a reduced power consumption and an increased processing speed while ensuring a sufficient signal holding characteristic, by optimizing the capacitance of the memory cell for each DRAM section according to the application thereof.

Since in the second embodiment the first capacitor lower electrode 209A is provided to have a shape obtained by combining the shapes of the plurality of second capacitor lower electrodes 209B, the following effects can be obtained. Even with the formation of a plurality of memory cell regions having different capacitance values on the same semiconductor substrate 200, as long as only the respective capacitor lower electrodes 209 in the memory cell regions (i.e., the first memory region $R_A$ and the second memory region $R_B$) are designed to have different layouts while maintaining their standard shape, the respective other members, e.g., the contact plugs 208 or the impurity diffusion layers 206, located in the memory cell regions need not be designed to have different layouts. As a result, a capacitor formation region located in the first memory region $R_A$ can be made larger than that located in the second memory region $R_B$ without complicating a semiconductor device fabricating process. Therefore, each memory cell located in the first memory region $R_A$ can have a larger capacitance than that located in the second memory region $R_B$. Thus, the above-mentioned effects of the present embodiment can certainly be obtained.

Figure 5A:
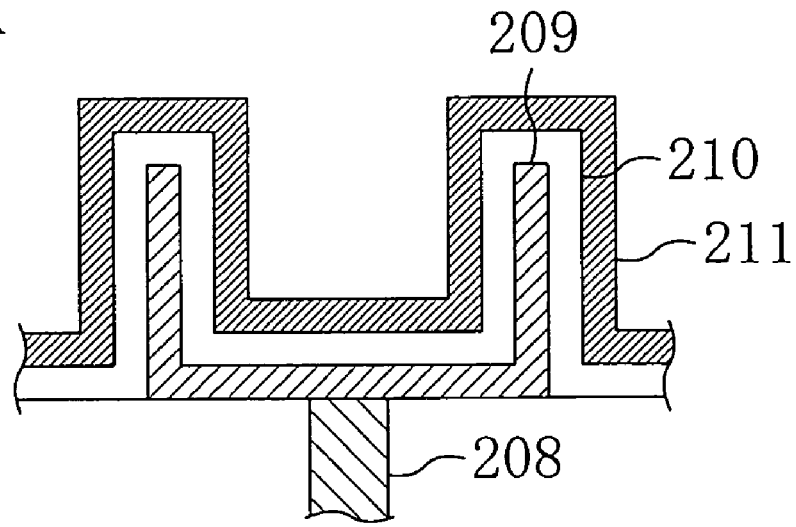
FIGS. 5A and 5B are cross-sectional views illustrating variations of the cell capacitor structure of each of semiconductor devices according to second through fourth embodiments of the present invention.
Figure 5B:
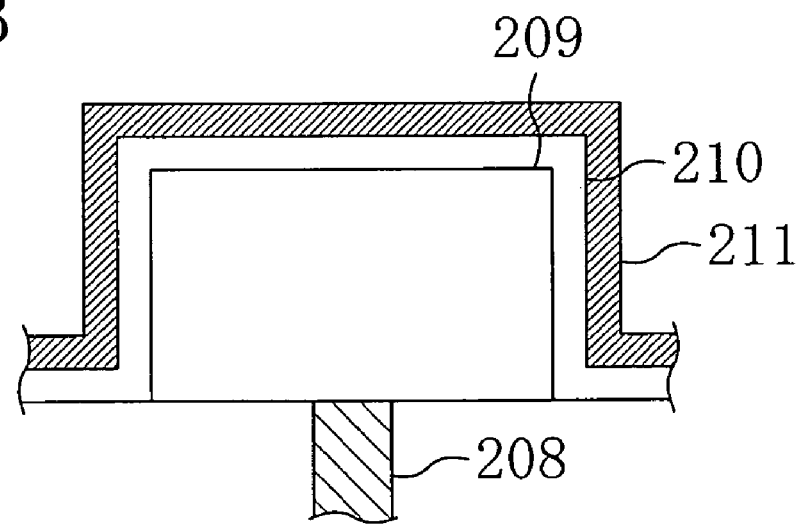

In the second embodiment, the cup-like capacitor lower electrodes 209 are formed in the first memory region $R_A$ and the second memory region $R_B$, respectively, and only the bottom and inner wall surfaces of each capacitor lower electrode 209 are utilized as a cell capacitor. Instead, as illustrated in FIG. 5A, not only the bottom and inner wall surfaces of each cup-like capacitor lower electrode 209 but also the outer wall surfaces thereof may be utilized as a cell capacitor. Alternatively, cell capacitors each having another configuration, e.g., cell capacitors each having a cylindrical configuration as illustrated in FIG. 5B, may be used instead of the cup-like capacitor lower electrodes 209, i.e., the cup-like cell capacitors.

Furthermore, although in the second embodiment phosphorus-containing silicon is used for the first capacitor lower electrode 209A, the second capacitor lower electrode 209B and the capacitor upper electrode 211, silicon containing any other impurity or any other metal may alternatively be used.

Moreover, although in the second embodiment an ON film is used as the capacitor insulating film 210, any other insulating film may alternatively be used.

Modification of Embodiment 2

A semiconductor device according to a modification of the second embodiment of the present invention will now be described with reference to the drawings.

Figure 6A:
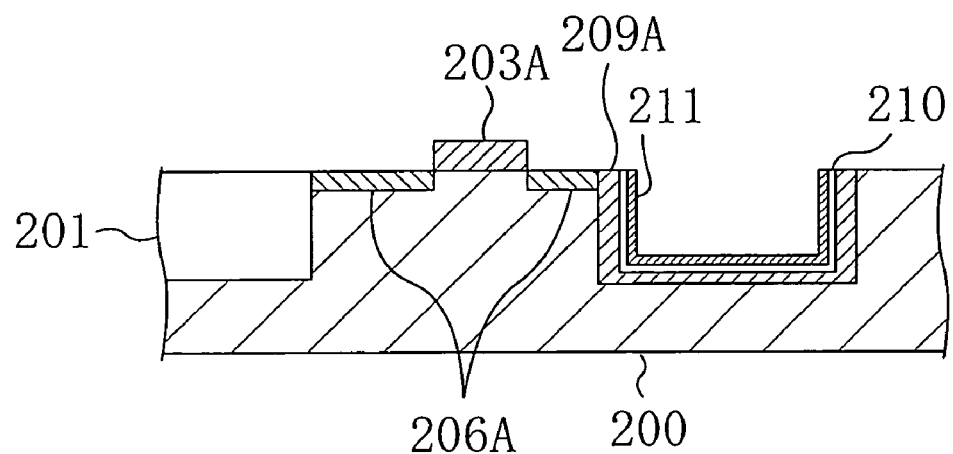
FIGS. 6A and 6B are cross-sectional views illustrating the structures of memory cells in the first memory region $R_A$ and the second memory region $R_B$, respectively, according to a modification of the second embodiment of the present invention.
Figure 6B:
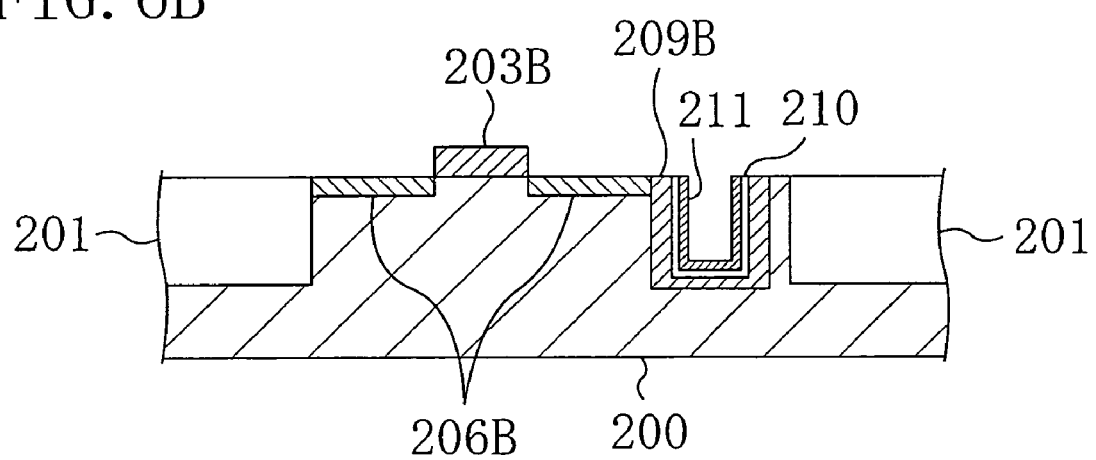

A plane structure of the present modification is similar to that of the second embodiment illustrated in FIG. 2A. FIG. 6A is a cross-sectional view illustrating the configuration of a memory cell located in a first memory region $R_A$ in which a first DRAM section 102 of the present modification is formed, and FIG. 6B is a cross-sectional view illustrating the configuration of a memory cell located in a second memory region $R_B$ in which a second DRAM section 103 of the present modification is formed. Note that in FIGS. 6A and 6B, the same members as those of the semiconductor device of the second embodiment illustrated in FIGS. 2B and 2C will be denoted by the same reference numerals. Thus, a description thereof will not be given.

As illustrated in FIGS. 6A and 6B, the present modification is different from the second embodiment in that a capacitor of a trench structure is used instead of a capacitor of a stacked structure. More particularly, in the present modification, cell capacitors located in both the memory regions $R_A$ and $R_B$ are embedded in trenches provided in the semiconductor substrate 200, respectively, and a capacitor lower electrode 209 of each cell capacitor is connected directly with an associated impurity diffusion layer 206.

The above-described modification also provides the effects similar to those of the second embodiment.

Embodiment 3

A semiconductor device and a method for fabricating the same according to a third embodiment of the present invention will now be described with reference to the drawings.

Figure 7A:
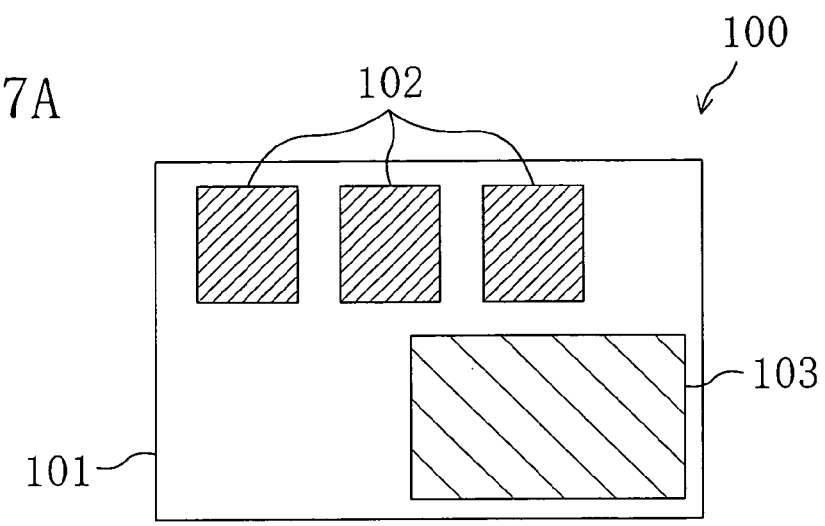
FIG. 7A is a plan view illustrating a general configuration of a semiconductor device according to a third embodiment of the present invention.

FIG. 7A is a plan view illustrating a general configuration of the semiconductor device according to the third embodiment.

Like the first embodiment illustrated in FIG. 1A, as illustrated in FIG. 7A, a CMOS logic section 101 is formed on a chip 100, and a first DRAM section 102 and a second DRAM section 103 are formed on the same chip 100. The first DRAM section 102 is intended to provide temporary storage of data being processed at a high speed, i.e., to store a charge that is moved at a high speed. In contrast, the second DRAM section 103 is intended to hold a signal written thereto sufficiently long (for example, at an operating temperature of approximately 85 through 100° C. for approximately a few hundreds or more of msec).

Figure 7B:
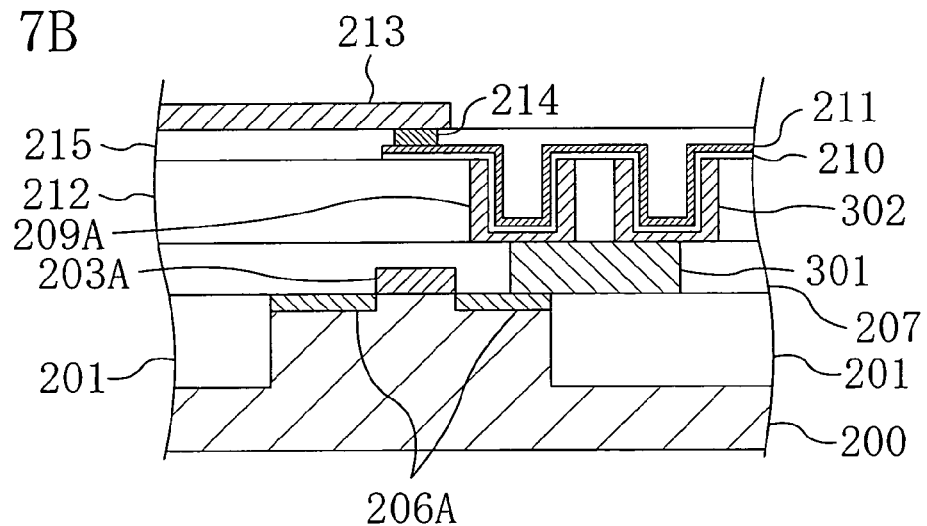
FIG. 7B is a cross-sectional view illustrating the configuration of a memory cell in a first memory region $R_A$ in which the first DRAM section is formed as illustrated in FIG. 7A.
Figure 7C:
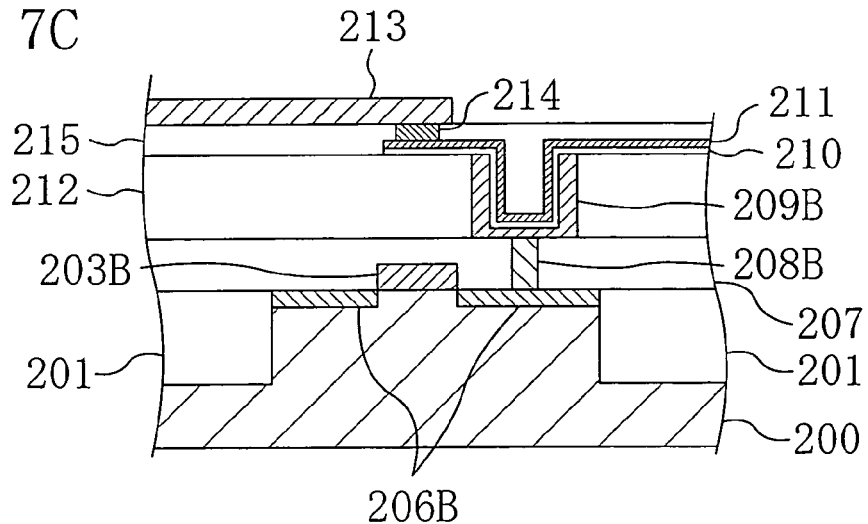
FIG. 7C is a cross-sectional view illustrating the configuration of a memory cell in a second memory region $R_B$ in which the second DRAM section is formed as illustrated in FIG. 7A.

FIG. 7B is a cross-sectional view illustrating the configuration of a memory cell in a first memory region $R_A$ in which the first DRAM section 102 is formed as illustrated in FIG. 7A, and FIG. 7C is a cross-sectional view illustrating the configuration of a memory cell in a second memory region $R_B$ in which the second DRAM section 103 is formed as illustrated in FIG. 7A.

As illustrated in FIG. 7B, a first gate electrode 203A is formed on an element region of a semiconductor substrate 200 surrounded by an isolation 201 in a first memory region $R_A$ with a gate insulating film (unshown) interposed between the first gate electrode 203A and the semiconductor substrate 200. A first impurity diffusion layer 206A is formed in the element region so as to be placed at both sides of the first gate electrode 203A. Thus, a transfer transistor for the first memory region $R_A$ is formed of the first gate electrode 203A and the first impurity diffusion layer 206A.

Meanwhile, as illustrated in FIG. 7C, a second gate electrode 203B is formed on an element region of the semiconductor substrate 200 surrounded by an isolation 201 in a second memory region $R_B$ with a gate insulating film (unshown) interposed between the second gate electrode 203B and the semiconductor substrate 200. A second impurity diffusion layer 206B is formed in the element region so as to be placed at both sides of the second gate electrode 203B. Thus, a transfer transistor located for the second memory region $R_B$ is formed of the second gate electrode 203B and the second impurity diffusion layer 206B.

Furthermore, as illustrated in FIGS. 7B and 7C, a first interlayer insulating film 207 is formed on the semiconductor substrate 200 on which the gate electrodes 203A and 203B are formed. A first contact plug 301 is formed in a part of the first interlayer insulating film 207 located in the first memory region $R_A$ to allow connection with the first impurity diffusion layer 206A, and a second contact plug 208B is formed in a part of the first interlayer insulating film 207 located in the second memory region $R_B$ to allow connection with the second impurity diffusion layer 206B. In this relation, the first contact plug 301 is thicker than the second contact plug 208B because of the reason that will be described later.

Furthermore, as illustrated in FIGS. 7B and 7C, a second interlayer insulating film 212 is formed on the first interlayer insulating film 207 in which the contact plugs 301 and 208B are embedded. In this relation, a plurality of (e.g., two) trenches for the formation of capacitors are formed in a part of the second interlayer insulating film 212 located in the first memory region $R_A$ to reach the first contact plug 301, and a single trench for the formation of a capacitor is formed in a part of the second interlayer insulating film 212 located in the second memory region $R_B$ to reach the second contact plug 208B. Electrode parts 209A and 302 of a capacitor are formed to cover the bottom and wall surfaces of the corresponding trenches for the formation of capacitors in the first memory region $R_A$ and allow electrical connection with the first contact plug 301. More specifically, a capacitor lower electrode (a first capacitor lower electrode) in the first memory region $R_A$ is composed of the adjacent electrode parts 209A and 302. Furthermore, a second capacitor lower electrode 209B is formed to cover the bottom and wall surfaces of the trench for the formation of a capacitor in the second memory region $R_B$ and allow electrical connection with the second contact plug 208B. In this relation, the configuration and shape of each electrode part 209A and 302 of the first capacitor lower electrode are the same as those of the second capacitor lower electrode 209B.

Figure 8A:
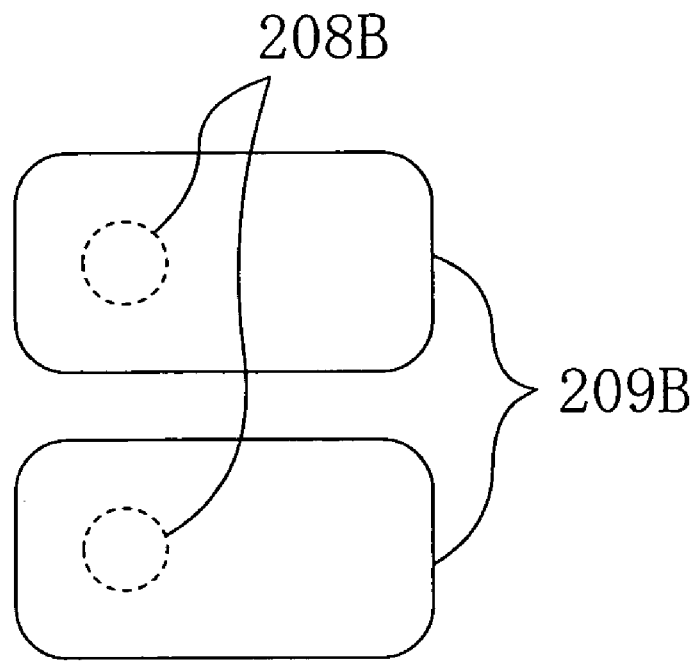
FIG. 8A is a diagram illustrating the shapes of a capacitor lower electrode and a contact plug both formed in the second memory region $R_B$ of the semiconductor device according to the third embodiment of the present invention.

More particularly, as illustrated in FIG. 8A, the second capacitor lower electrode 209B of each cell capacitor located in the second memory region $R_B$ is electrically connected through the corresponding plug 208B to the second impurity diffusion layer 206B.

Figure 8B:
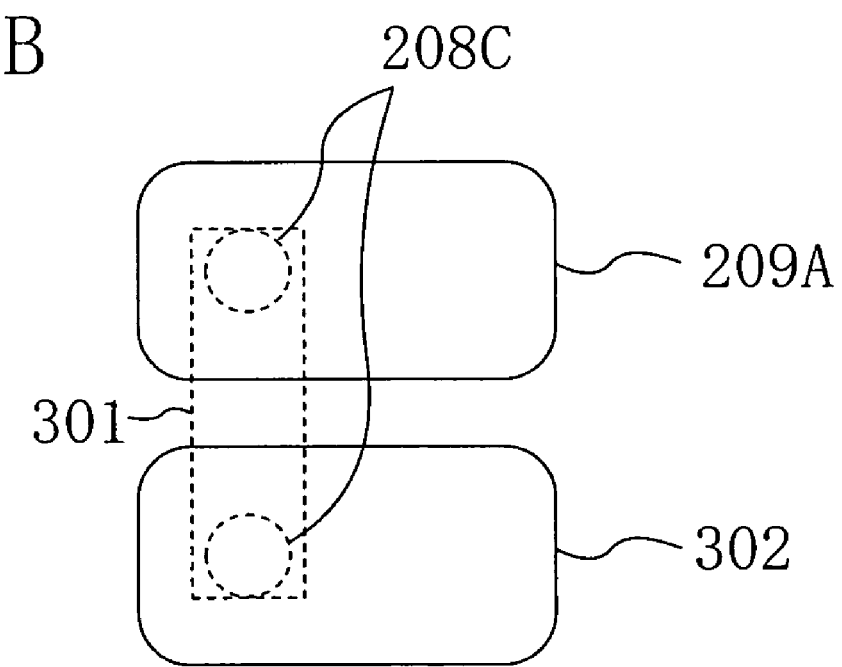
FIG. 8B is a diagram illustrating the shapes of a capacitor lower electrode and a contact plug both formed in the first memory region $R_A$ of the semiconductor device according to the third embodiment of the present invention.

On the other hand, features of the present invention is as follows: as illustrated in FIG. 8B, the first capacitor lower electrode of each cell capacitor located in the first memory region $R_A$ is composed of the plurality of adjacent electrode parts 209A and 302 each having the same structure as the second capacitor lower electrode 209B; and the electrode parts 209A and 302 are electrically connected through the same plug 301 to the first impurity diffusion layer 206A. Virtual plugs 208C having the same structure as the plug 208B located in the second memory region $R_B$ are illustrated in FIG. 8B for the sake of comparison.

Furthermore, as illustrated in FIGS. 7B and 7C, a capacitor insulating film 210 is formed to cover the electrode parts 209A and 302 constituting the first capacitor lower electrode and the second capacitor lower electrode 209B, and a capacitor upper electrode 211 is formed to cover the capacitor insulating film 210. Thus, a cell capacitor of the first DRAM section 102 is formed in the first memory region $R_A$, and a cell capacitor of the second DRAM section 103 is formed in the second memory region $R_B$. Although not shown, cell capacitors (i.e., memory cells) are arranged in matrix form in each memory region $R_A$ and $R_B$.

Furthermore, as illustrated in FIGS. 7B and 7C, a third interlayer insulating film 215 is formed on the entire surface of each cell capacitor located in the memory regions $R_A$ and $R_B$ and the top surface of the second interlayer insulating film 212. A plurality of plugs 214 are formed in the third interlayer insulating film 215 to allow electrical connection with the respective cell capacitors (actually, the capacitor upper electrodes 211) located in the memory regions $R_A$ and $R_B$. A wiring layer 213 is formed on the third interlayer insulating film 215 to allow electrical connection with the plugs 214.

Next, a method for fabricating the semiconductor device according to the third embodiment, more specifically, a method for fabricating the semiconductor device illustrated in FIGS. 7B and 7C, will be described with reference to the drawings.

FIGS. 9A through 9E are cross-sectional views illustrating steps in the method for fabricating the semiconductor device according to the third embodiment. Note that in FIGS. 9A through 9E, the same members as those of the semiconductor device of the third embodiment illustrated in FIGS. 7B and 7C will be denoted by the same reference numerals.

Figure 9A:
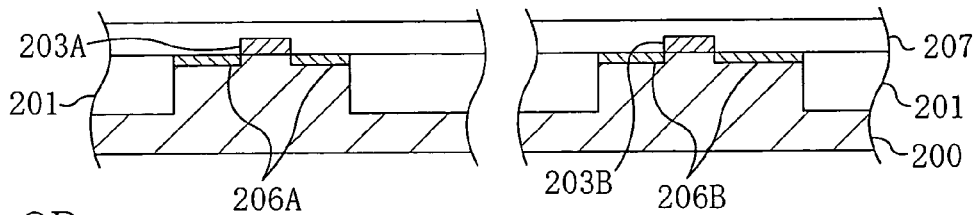
FIGS. 9A through 9E are cross-sectional views illustrating steps in a method for fabricating the semiconductor device according to the third embodiment of the present invention.

First, as illustrated in FIG. 9A, a first gate electrode 203A is formed on a memory cell formation region of a semiconductor substrate 200 surrounded by an isolation 201 in a first memory region $R_A$ with a gate insulating film (unshown) interposed between the first gate electrode 203A and the semiconductor substrate 200. A second gate electrode 203B is formed on a memory cell formation region of the semiconductor substrate 200 surrounded by the isolation 201 in a second memory region $R_B$ with a gate insulating film (unshown) interposed between the second gate electrode 203B and the semiconductor substrate 200. Next, impurities are implanted into parts of the semiconductor substrate 200 located at both sides of the first and second electrodes 203A and 203B, thereby forming a first impurity diffusion layer 206A and a second impurity diffusion layer 206B. Then, a first interlayer insulating film 207 is deposited across the entire surface of the semiconductor substrate 200.

Figure 9B:
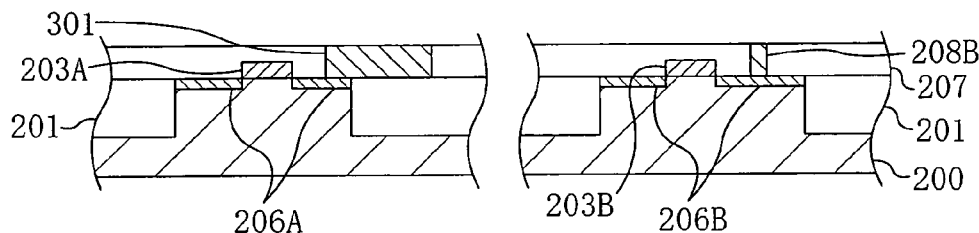

Next, contact holes are formed, by photolithography and etching, in parts of the first interlayer insulating film 207 located in the first memory region $R_A$ and the second memory region $R_B$ to reach the first impurity diffusion layer 206A and the second impurity diffusion layer 206B, respectively. Then, a conductive film is formed across the entire surface of the semiconductor substrate 200 to completely fill each contact hole. Then, an unnecessary portion of the conductive film located outside each contact hole is removed, thereby forming, as illustrated in FIG. 9B, a first contact plug 301 electrically connected to the first impurity diffusion layer 206A and a second contact plug 208B electrically connected to the second impurity diffusion layer 206B.

In this case, the size (thickness) of the contact plug 301 formed in the first memory region $R_A$ is made equivalent to the size of a first capacitor lower electrode that will be formed later, i.e., the size obtained by combining two or more of second capacitor lower electrodes 209B for the second memory region $R_B$. More particularly, in the present embodiment, the first memory region $R_A$ and the second memory region $R_B$ are different from each other in the layouts of masks used in a process step of patterning the first interlayer insulating film 207 to form contact plugs in the memory regions $R_A$ and $R_B$, respectively.

Figure 9C:
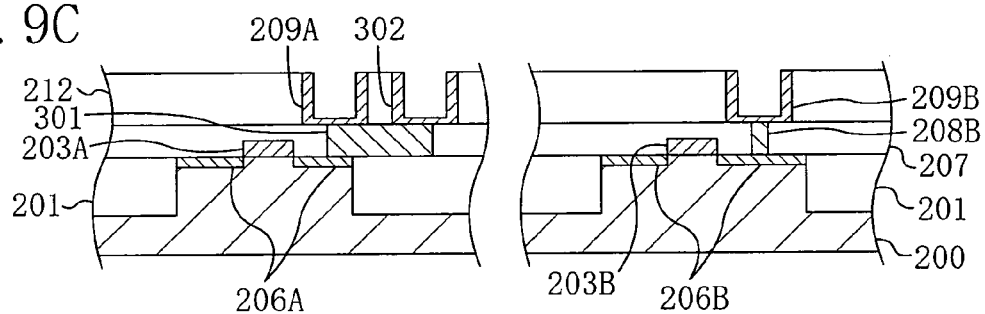

Next, as illustrated in FIG. 9C, a second interlayer insulating film 212 is deposited on the entire surface of the semiconductor substrate 200, and then a plurality of (e.g., two) trenches for the formation of capacitors are formed in a part of the second interlayer insulating film 212 located in the first memory region $R_A$ to reach the first contact plug 301. Simultaneously, a trench for the formation of a capacitor is formed in a part of the second interlayer insulating film 212 located in the second memory region $R_B$ to reach the second contact plug 208B. Subsequently, electrode parts 209A and 302 of a capacitor are formed to cover the bottom and wall surfaces of corresponding trenches for the formation of capacitors in the first memory region $R_A$, thereby forming a first capacitor lower electrode. Simultaneously, a second capacitor lower electrode 209B is formed to cover the bottom and wall surfaces of a trench for the formation of a capacitor in the second memory region $R_B$. In this relation, the electrode parts 209A and 302 are electrically connected to the same contact plug 301. For example, phosphorus-containing silicon is used for the electrode parts 209A and 302 constituting the first capacitor lower electrode and the second capacitor lower electrode 209B. In the present embodiment, the configuration and shape of each of the electrode parts 209A and 302 constituting the first capacitor lower electrode are the same as those of the second capacitor lower electrode 209B. Therefore, the layouts of masks used in a process step of patterning the second interlayer insulating film 212 to form trenches for the formation of capacitors in the first and second memory regions $R_A$ and $R_B$, respectively, are the same.

Figure 9D:
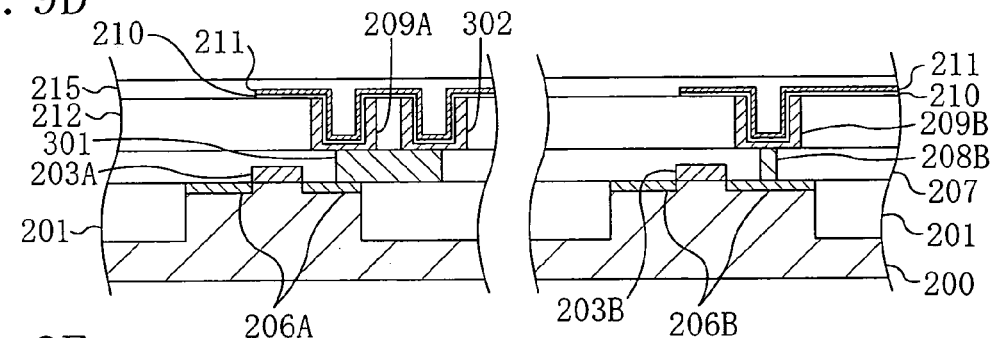

Next, as illustrated in FIG. 9D, capacitor insulating films 210, which are layered films of a silicon oxide film and a silicon nitride film (ON films), for example, are formed to cover the electrode parts 209A and 302 constituting the first capacitor lower electrode and the second capacitor lower electrode 209B, respectively. Then, capacitor upper electrodes 211 made of phosphorus-containing silicon, for example, are formed to cover the capacitor insulating films 210, respectively. Thus, a cell capacitor of the first DRAM section 102 is formed in the first memory region $R_A$, and a cell capacitor of the second DRAM section 103 is formed in the second memory region $R_B$.

Figure 9E:
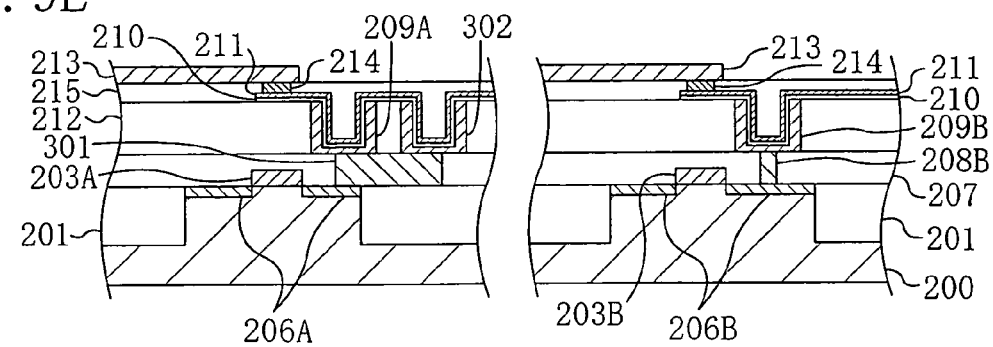

Thereafter, a third interlayer insulating film 215 is formed across the entire surface of the semiconductor substrate 200. Then, as illustrated in FIG. 9E, a plurality of plugs 214 are formed in the third interlayer insulating film 215 to allow electrical connection with the capacitor upper electrodes 211 in both the memory regions $R_A$ and $R_B$. Then, a wiring layer 213 is formed on the third interlayer insulating film 215 to allow electrical connection with the plugs 214. With the above process steps, the first DRAM section 102 and the second DRAM section 103 are formed in the first memory region $R_A$ and the second memory region $R_B$, respectively.

As described above, according to the third embodiment, when cell capacitors are formed on parts of the semiconductor substrate 200 located in the first memory region $R_A$ and the second memory region $R_B$, cell capacitors are formed in the first memory region $R_A$ to each have a configuration obtained by combining two or more of the cell capacitors for the second memory region $R_B$. To be specific, a capacitor lower electrode (first capacitor lower electrode) composed of a plurality of electrode parts 209A and 302 is formed in the first memory region $R_A$, and the electrode parts 209 and 302 each have the same configuration as the capacitor lower electrode (the second capacitor lower electrode 209B) located in the second memory region $R_B$. Simultaneously, the plurality of electrode parts 209A and 302 are connected through the same plug (first plug) 301 to the semiconductor substrate 200. Thus, the cell capacitance of the cell capacitor located in the first memory region $R_A$ can be made larger than that of the cell capacitor located in the second memory region $R_B$.

More specifically, according to the third embodiment, as long as only plugs through which the semiconductor substrate 200 is connected to the capacitor lower electrodes in the first memory region $R_A$ and the second memory region $R_B$, respectively, are designed to have different layouts, the respective other members, e.g., capacitor lower electrodes or impurity diffusion layers, located in the memory regions $R_A$ and $R_B$ need not be designed to have different layouts. As a result, the capacitance of each cell capacitor located in the first memory region $R_A$ can be made larger than that of each cell capacitor located in the second memory region $R_B$ without complicating a semiconductor device fabricating process. Thus, also when the first DRAM section 102 composed of memory cells each having a large cell capacitance is formed in the first memory region $R_A$ and the first DRAM section 102 is operated at a high speed, charge can sufficiently be stored in the memory cells of the first DRAM section 102 without increasing the operating voltage of the first DRAM section 102. More particularly, since a signal stored in a memory cell of the first DRAM section 102 does not become an error signal, this can prevent misoperation from occurring and the first DRAM section 102 can be operated at a high speed. In addition, since the operating voltage of the first DRAM section 102 does not have to be increased, this can reduce consumed power. On the other hand, when the second DRAM section 103 composed of memory cells each having a small capacitance is formed in the second memory region $R_B$, the low-speed operation of the second DRAM section 103 allows sufficient increase in the voltage applied to each memory cell thereof. This can provide a sufficient charge holding characteristic (signal holding characteristic). Thus, a desired DRAM operation can be expected.

As described above, since in the present embodiment a plurality of DRAM sections are composed of cell capacitors of a plurality of kinds having different capacitances, a DRAM-embedded device in which a plurality of DRAM sections are mounted together with the CMOS logic section on the same chip can achieve both a reduced power consumption and an increased processing speed while ensuring a sufficient signal holding characteristic, by optimizing the capacitance of the memory cell for each DRAM section according to the application thereof.

In the third embodiment, the cup-like electrode parts 209A and 302 and the cup-like capacitor lower electrode 209B are formed in the first memory region $R_A$ and the second memory region $R_B$, respectively, and only the bottom and inner wall surfaces of the electrode parts 209A and 302 and the capacitor lower electrode 209B are utilized as cell capacitors. Instead, not only the bottom and inner wall surfaces of the cup-like electrode parts 209A and 302 and the cup-like capacitor lower electrode 209B but also the outer wall surfaces thereof may be utilized as cell capacitors (see FIG. 5A). Alternatively, cell capacitors each having another configuration, e.g., cell capacitors each having a cylindrical configuration, may be used instead of the cup-like electrode parts and the cup-like capacitor lower electrode, i.e., the cup-like cell capacitors (see FIG. 5B).

Furthermore, although in the third embodiment phosphorus-containing silicon is used for the electrode parts 209A and 302 and the capacitor lower electrode 209B or the capacitor upper electrode 211, silicon containing any other impurity or any other metal may alternatively be used.

Moreover, although in the third embodiment an ON film is used as the capacitor insulating film 210, any other insulating film may alternatively be used.

Embodiment 4

A semiconductor device and a method for fabricating the same according to a fourth embodiment of the present invention will now be described with reference to the drawings.

Figure 10A:
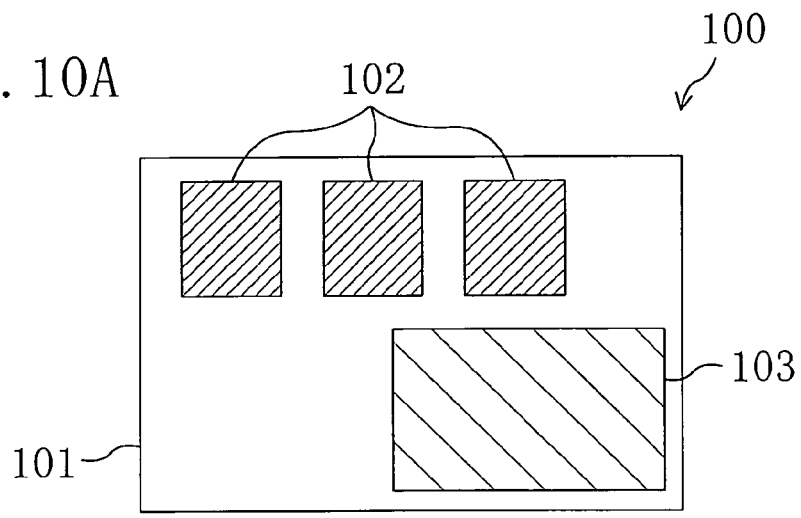
FIG. 10A is a plan view illustrating a general configuration of a semiconductor device according to a fourth embodiment of the present invention.

FIG. 10A is a plan view illustrating a general configuration of the semiconductor device according to the fourth embodiment.

Like the first embodiment illustrated in FIG. 1A, as illustrated in FIG. 10A, a CMOS logic section 101 is formed on a chip 100, and a first DRAM section 102 and a second DRAM section 103 are formed on the same chip 100. The first DRAM section 102 is intended to provide temporary storage of data being processed at a high speed, i.e., to store a charge that is moved at a high speed. In contrast, the second DRAM section 103 is intended to hold a signal written thereto sufficiently long (for example, at an operating temperature of approximately 85 through 100° C. for approximately a few hundreds or more of msec).

Figure 10B:
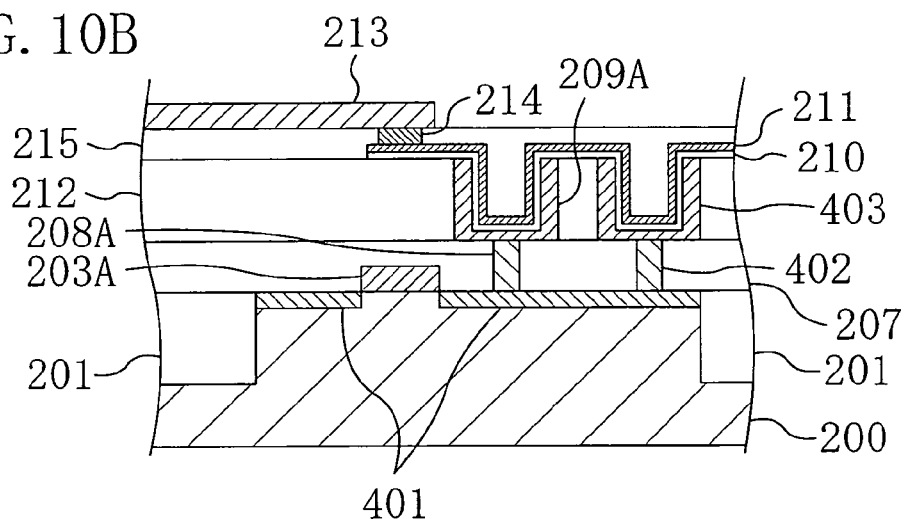
FIG. 10B is a cross-sectional view illustrating the configuration of a memory cell in a first memory region $R_A$ in which the first DRAM section is formed as illustrated in FIG. 10A.
Figure 10C:
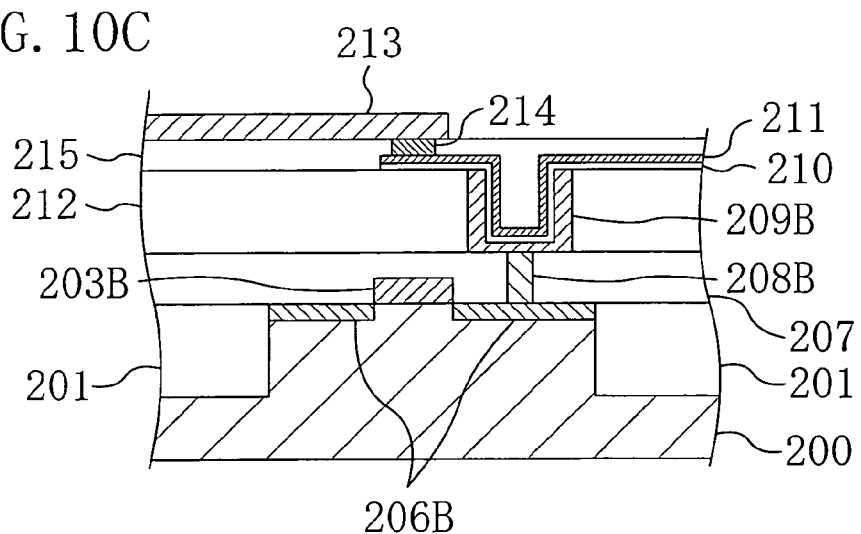
FIG. 10C is a cross-sectional view illustrating the configuration of a memory cell in a second memory region $R_B$ in which the second DRAM section is formed as illustrated in FIG. 10A.

FIG. 10B is a cross-sectional view illustrating the configuration of a memory cell in a first memory region $R_A$ in which the first DRAM section 102 is formed as illustrated in FIG. 10A, and FIG. 10C is a cross-sectional view illustrating the configuration of a memory cell in a second memory region $R_B$ in which the second DRAM section 103 is formed as illustrated in FIG. 10A.

As illustrated in FIG. 10B, a first gate electrode 203A is formed on an element region of a semiconductor substrate 200 surrounded by an isolation 201 in a first memory region $R_A$ with a gate insulating film (unshown) interposed between the first gate electrode 203A and the semiconductor substrate 200. A first impurity diffusion layer 401 is formed in the element region so as to be placed at both sides of the first gate electrode 203A. Thus, a transfer transistor for the first memory region $R_A$ is formed of the first gate electrode 203A and the first impurity diffusion layer 401. In this relation, the region where the first impurity diffusion layer 401 is formed is set within the range in which the first impurity diffusion layer 401 can be connected to a plurality of contact plugs that will be described later.

Meanwhile, as illustrated in FIG. 10C, a second gate electrode 203B is formed on an element region of the semiconductor substrate 200 surrounded by an isolation 201 in a second memory region $R_B$ with a gate insulating film (unshown) interposed between the second gate electrode 203B and the semiconductor substrate 200. A second impurity diffusion layer 206B is formed in the element region so as to be placed at both sides of the second gate electrode 203B. Thus, a transfer transistor for the second memory region $R_B$ is formed of the second gate electrode 203B and the second impurity diffusion layer 206B.

Furthermore, as illustrated in FIGS. 10B and 10C, a first interlayer insulating film 207 is formed on the semiconductor substrate 200 on which the gate electrodes 203A and 203B are formed. A plurality of (e.g., two) contact plugs 208A and 402 are formed in a part of the first interlayer insulating film 207 located in the first memory region $R_A$ to allow connection with the first impurity diffusion layer 401, and a contact plug 208B is formed in a part of the first interlayer insulating film 207 located in the second memory region $R_B$ to allow connection with the second impurity diffusion layer 206B. In this relation, the configuration and shape of each contact plug 208A and 402 are the same as those of the contact plug 208B.

Furthermore, as illustrated in FIGS. 10B and 10C, a second interlayer insulating film 212 is formed on the first interlayer insulating film 207 in which the contact plugs 208A, 402 and 208B are embedded. In this relation, a plurality of (specifically, two) trenches for the formation of capacitors are formed in a part of the second interlayer insulating film 212 located in the first memory region $R_A$ to reach the contact plugs 208A and 402, respectively, and a single trench for the formation of a capacitor is formed in a part of the second interlayer insulating film 212 located in the second memory region $R_B$ to reach the contact plug 208B. Electrode parts 209A and 403 of a capacitor are formed to cover the bottom and wall surfaces of the corresponding trenches for the formation of capacitors in the first memory region $R_A$ and allow electrical connection with the contact plugs 208A and 402, respectively. More specifically, a capacitor lower electrode (a first capacitor lower electrode) in the first memory region $R_A$ is composed of adjacent electrode parts 209A and 403. Furthermore, a second capacitor lower electrode 209B is formed to cover the bottom and wall surfaces of the trench for the formation of a capacitor in the second memory region $R_B$ and allow electrical connection with the second contact plug 208B. In this relation, the configuration and shape of each electrode part 209A and 403 of the first capacitor lower electrode are the same as those of the second capacitor lower electrode 209B.

Figure 11A:
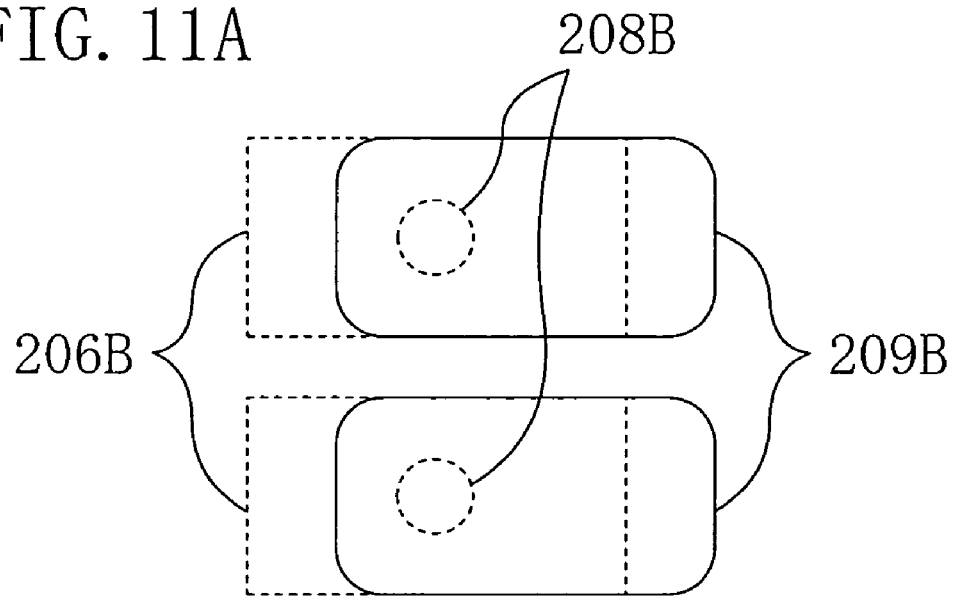
FIG. 11A is a diagram illustrating the shapes of a capacitor lower electrode, a contact plug and an impurity diffusion layer all formed in the second memory region $R_B$ of the semiconductor device according to the fourth embodiment of the present invention.

More particularly, as illustrated in FIG. 11A, the second capacitor lower electrode 209B of each cell capacitor located in the second memory region $R_B$ is electrically connected through the corresponding plug 208B to the corresponding impurity diffusion layer 206B located in the semiconductor substrate 200.

Figure 11B:
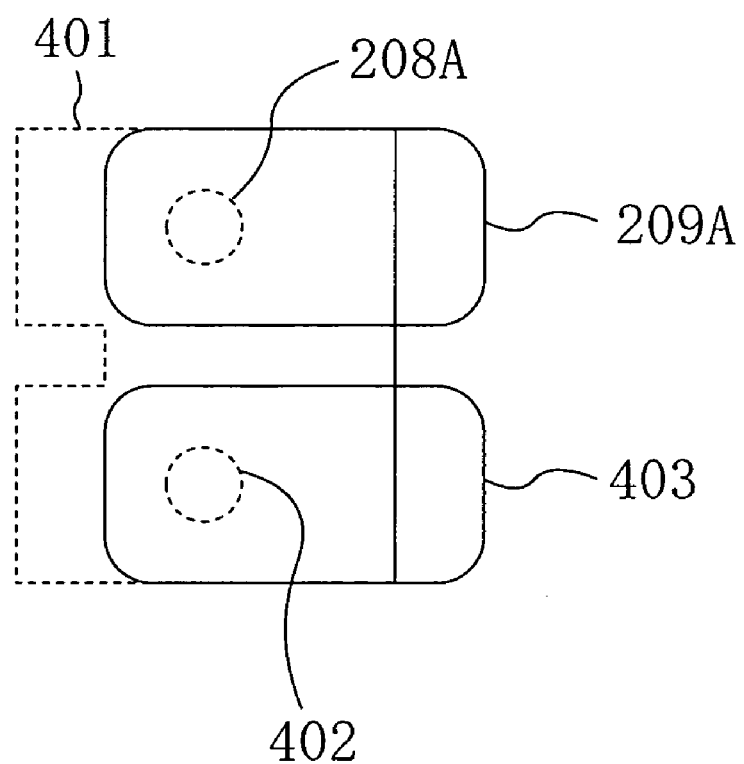
FIG. 11B is a diagram illustrating the shapes of a capacitor lower electrode, a contact plug and an impurity diffusion layer all formed in the first memory region $R_A$ of the semiconductor device according to the fourth embodiment of the present invention.

On the other hand, features of the present invention is as follows: as illustrated in FIG. 11B, the first capacitor lower electrode of each cell capacitor located in the first memory region $R_A$ is composed of the plurality of adjacent electrode parts 209A and 403 each having the same structure as the second capacitor lower electrode 209B; and the electrode parts 209A and 403 are electrically connected through the corresponding plugs 208A and 402 to the same impurity diffusion layer 401 located in the semiconductor substrate 200.

Furthermore, as illustrated in FIGS. 10B and 10C, a capacitor insulating film 210 is formed to cover the electrode parts 209A and 403 constituting the first capacitor lower electrode and the second capacitor lower electrode 209B, and a capacitor upper electrode 211 is formed to cover the capacitor insulating film 210. Thus, a cell capacitor of the first DRAM section 102 is formed in the first memory region $R_A$, and a cell capacitor of the second DRAM section 103 is formed in the second memory region $R_B$. Although not shown, cell capacitors (i.e., memory cells) are arranged in matrix form in each memory region $R_A$ and $R_B$.

Furthermore, as illustrated in FIGS. 10B and 10C, a third interlayer insulating film 215 is formed on the entire surface of each cell capacitor located in the memory regions $R_A$ and $R_B$ and the top surface of the second interlayer insulating film 212. A plurality of plugs 214 are formed in the third interlayer insulating film 215 to allow electrical connection with the respective cell capacitors (actually, the capacitor upper electrodes 211) located in the memory regions $R_A$ and $R_B$. A wiring layer 213 is formed on the third interlayer insulating film 215 to allow electrical connection with the plugs 214.

Next, a method for fabricating the semiconductor device according to the fourth embodiment, more specifically, a method for fabricating the semiconductor device illustrated in FIGS. 10B and 10C, will be described with reference to the drawings.

FIGS. 12A through 12E are cross-sectional views illustrating steps in the method for fabricating the semiconductor device according to the fourth embodiment. Note that in FIGS. 12A through 12E, the same members as those of the semiconductor device of the fourth embodiment illustrated in FIGS. 10B and 10C will be denoted by the same reference numerals.

Figure 12A:
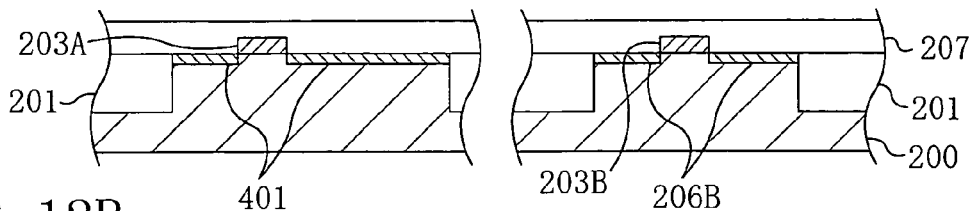
FIGS. 12A through 12E are cross-sectional views illustrating steps in a method for fabricating the semiconductor device according to the fourth embodiment of the present invention.

First, as illustrated in FIG. 12A, a first gate electrode 203A is formed on a memory cell formation region of a semiconductor substrate 200 surrounded by an isolation 201 in a first memory region $R_A$ with a gate insulating film (unshown) interposed between the first gate electrode 203A and the semiconductor substrate 200. A second gate electrode 203B is formed on a memory cell formation region of the semiconductor substrate 200 surrounded by the isolation 201 in a second memory region $R_B$ with a gate insulating film (unshown) interposed between the second gate electrode 203B and the semiconductor substrate 200. Next, impurities are implanted into parts of the semiconductor substrate 200 located at both sides of the first and second electrodes 203A and 203B, respectively, thereby forming a first impurity diffusion layer 401 and a second impurity diffusion layer 206B. In this relation, while the region where the first impurity diffusion layer 401 is formed is set within the range in which the first impurity diffusion layer 401 can be connected to each of a plurality of contact plugs 208A and 402 (see FIG. 12B), the region where the second impurity diffusion layer 206B is formed is set within the range in which the second impurity diffusion layer 206B can be connected to the single contact plug 208B. More particularly, in the present embodiment, the first memory region $R_A$ and the second memory region $R_B$ are different from each other in the layouts of masks used in a process step of implanting impurities into the semiconductor substrate 200 to form impurity diffusion layers in the memory regions $R_A$ and $R_B$, respectively.

Figure 12B:
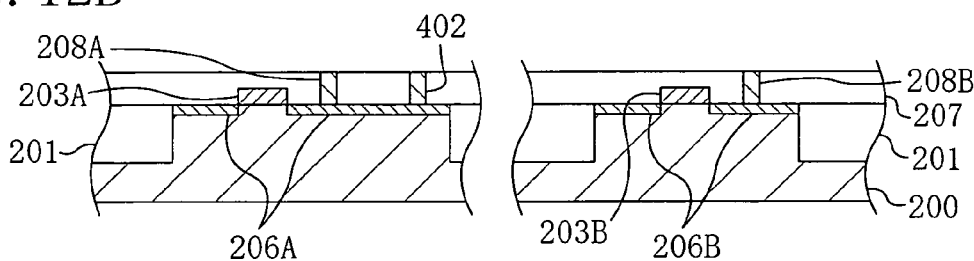

Next, a first interlayer insulating film 207 is deposited across the entire surface of the semiconductor substrate 200. Then, a plurality of (e.g., two) contact holes are formed, by photolithography and etching, in a part of the first interlayer insulating film 207 located in the first memory region $R_A$ to reach the first impurity diffusion layer 401, and a single contact hole is formed, by the same method, in a part of the first interlayer insulating film 207 located in the second memory region $R_B$ to reach the second impurity diffusion layer 206B. Thereafter, a conductive film is formed across the entire surface of the semiconductor substrate 200 to completely fill each contact hole. Then, an unnecessary portion of the conductive film located outside each contact hole is removed, thereby forming, as illustrated in FIG. 12B, contact plugs 208A and 402 electrically connected to the first impurity diffusion layer 401 and a contact plug 208B electrically connected to the second impurity diffusion layer 206B. In this relation, the contact plugs 208B and 402 formed in the first memory region $R_A$ are electrically connected to the same impurity diffusion layer 401.

Figure 12C:
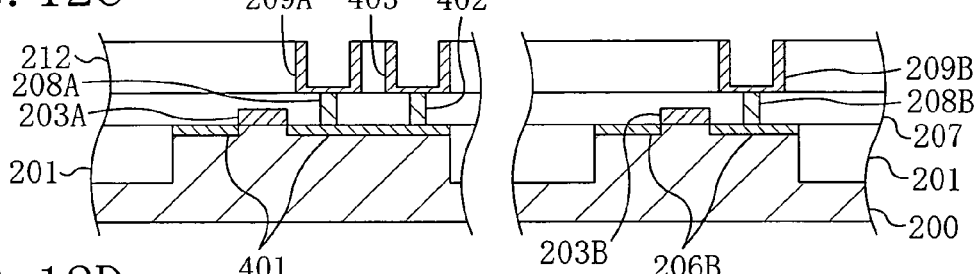

Next, as illustrated in FIG. 12C, a second interlayer insulating film 212 is deposited across the entire surface of the semiconductor substrate 200, and then a plurality of (e.g., two) trenches for the formation of capacitors are formed in a part of the second interlayer insulating film 212 located in the first memory region $R_A$ to reach the contact plugs 208A and 402. Simultaneously, a trench for the formation of a capacitor is formed in a part of the second interlayer insulating film 212 located in the second memory region $R_B$ to reach the second contact plug 208B. Subsequently, electrode parts 209A and 403 of a capacitor are formed to cover the bottom and wall surfaces of corresponding trenches for the formation of capacitors in the first memory region $R_A$, thereby forming a first capacitor lower electrode. Simultaneously, a second capacitor lower electrode 209B is formed to cover the bottom and wall surfaces of a trench for the formation of a capacitor in the second memory region $R_B$. For example, phosphorus-containing silicon is used for the electrode parts 209A and 403 constituting the first capacitor lower electrode and the second capacitor lower electrode 209B. In the present embodiment, the configuration and shape of each electrode part 209A and 403 of the first capacitor lower electrode are the same as those of the second capacitor lower electrode 209B. Therefore, the layouts of masks used in a process step of patterning the second interlayer insulating film 212 to form trenches for the formation of capacitors in the first and second memory regions $R_A$ and $R_B$, respectively, are the same.

Figure 12D:
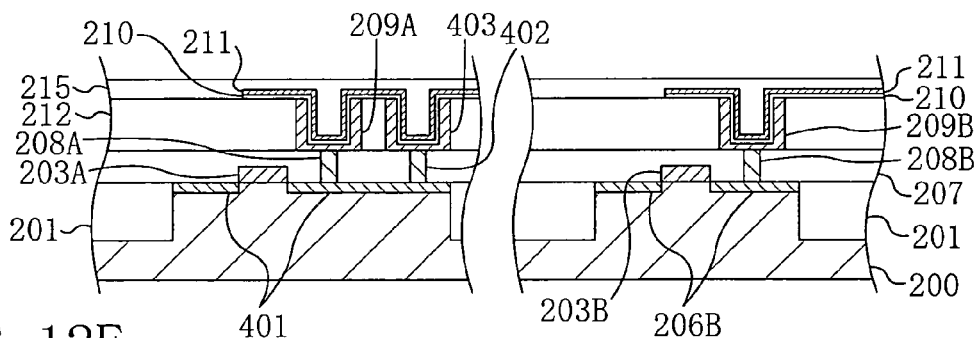

Next, as illustrated in FIG. 12D, capacitor insulating films 210, which are layered films of a silicon oxide film and a silicon nitride film (ON films), for example, are formed to cover the electrode parts 209A and 403 constituting the first capacitor lower electrode and the second capacitor lower electrode 209B, respectively. Then, capacitor upper electrodes 211 made of phosphorus-containing silicon, for example, are formed to cover the capacitor insulating films 210. Thus, a cell capacitor of the first DRAM section 102 is formed in the first memory region $R_A$, and a cell capacitor of the second DRAM section 103 is formed in the second memory region $R_B$.

Figure 12E:
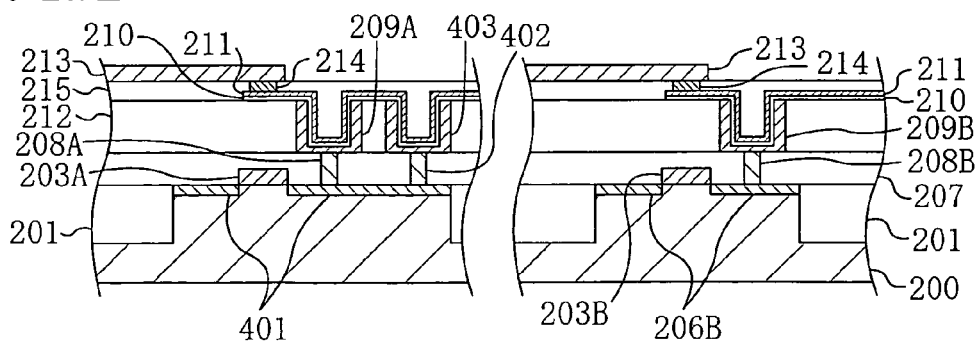

Thereafter, a third interlayer insulating film 215 is formed across the entire surface of the semiconductor substrate 200. Then, as illustrated in FIG. 12E, a plurality of plugs 214 are formed in the third interlayer insulating film 215 to allow electrical connection with the capacitor upper electrodes 211 in both the memory regions $R_A$ and $R_B$. Then, a wiring layer 213 is formed on the third interlayer insulating film 215 to allow electrical connection with the plugs 214. With the above process steps, the first DRAM section 102 and the second DRAM section 103 are formed in the first memory region $R_A$ and the second memory region $R_B$, respectively.

As described above, according to the fourth embodiment, when cell capacitors are formed on parts of the semiconductor substrate located in the first memory region $R_A$ and a second memory region $R_B$, cell capacitors are formed in the first memory region $R_A$ to each have a configuration obtained by combining two or more of the cell capacitors for the second memory region $R_B$. To be specific, a capacitor lower electrode (first capacitor lower electrode) composed of a plurality of electrode parts 209A and 403 is formed in the first memory region $R_A$, and the electrode parts 209A and 403 each have the same configuration as the capacitor lower electrode (the second capacitor lower electrode 209B) located in the second memory region $R_B$. Simultaneously, the plurality of electrode parts 209A and 403 are electrically connected through the respective plugs (plugs 208A and 402) to the same impurity diffusion layer (first impurity diffusion layer) 401. More particularly, while the second capacitor lower electrode 209B is electrically connected through the corresponding plug 208B to the corresponding impurity diffusion layer 206B, a plurality of electrode parts 209A and 403 of the first capacitor lower electrode are electrically connected through the corresponding plugs 208A and 402 to the first impurity diffusion layer 401 larger than the second impurity diffusion layer 206B. Thus, the cell capacitance of the cell capacitor located in the first memory region $R_A$ can be made larger than that located in the second memory region $R_B$.

More specifically, according to the fourth embodiment, as long as only impurity diffusion layers electrically connected through the plugs to the capacitor lower electrodes in the first memory region $R_A$ and the second memory region $R_B$, respectively, are designed to have different layouts, the respective other members, e.g., capacitor lower electrodes or plugs, located in the memory regions $R_A$ and $R_B$ need not be designed to have different layouts. As a result, the capacitance of each cell capacitor located in the first memory region $R_A$ can be made larger than that of each cell capacitor located in the second memory region $R_B$ without complicating a semiconductor device fabricating process. Thus, also when the first DRAM section 102 composed of memory cells each having a large cell capacitance is formed in the first memory region $R_A$ and the first DRAM section 102 is operated at a high speed, charge can sufficiently be stored in the memory cells of the first DRAM section 102 without increasing the operating voltage of the first DRAM section 102. More particularly, since a signal stored in a memory cell of the first DRAM section 102 does not become an error signal, this can prevent misoperation from occurring and the first DRAM section 102 can be operated at a high speed. In addition, since the operating voltage of the first DRAM section 102 does not have to be increased, this can reduce consumed power. On the other hand, when the second DRAM section 103 composed of memory cells each having a small capacitance is formed in the second memory region $R_B$, the low-speed operation of the second DRAM section 103 allows sufficient increase in the voltage applied to each memory cell thereof. This can provide a sufficient charge holding characteristic (signal holding characteristic). Thus, a desired DRAM operation can be expected.

In view of the above, since in the present embodiment a plurality of DRAM sections are composed of cell capacitors of a plurality of kinds having different capacitances, a DRAM-embedded device in which a plurality of DRAM sections are mounted together with the CMOS logic section on the same chip can achieve both a reduced power consumption and an increased processing speed while ensuring a sufficient signal holding characteristic, by optimizing the capacitance of the memory cell for each DRAM section according to the application thereof.

In the fourth embodiment, the cup-like electrode parts 209A and 403 and the cup-like capacitor lower electrode 209B are formed in the first memory region $R_A$ and the second memory region $R_B$, respectively, and only the bottom and inner wall surfaces of the electrode parts 209A and 403 and the capacitor lower electrode 209B are utilized as cell capacitors. Instead, not only the bottom and inner wall surfaces of the cup-like electrode parts 209A and 403 and the cup-like capacitor lower electrode 209B but also the outer wall surfaces thereof may be utilized as cell capacitors (see FIG. 5A). Alternatively, cell capacitors each having another configuration, e.g., cell capacitors each having a cylindrical configuration, may be used instead of the cup-like electrode parts and the cup-like capacitor lower electrode, i.e., the cup-like cell capacitors (see FIG. 5B).

Furthermore, although in the fourth embodiment phosphorus-containing silicon is used for the electrode parts 209A and 403, the capacitor lower electrode 209B and the capacitor upper electrode 211, silicon containing any other impurity or any other metal may alternatively be used.

Moreover, although in the fourth embodiment an ON film is used as the capacitor insulating film 210, any other insulating film may alternatively be used.

Modification of Embodiment 4

A semiconductor device according to a modification of the fourth embodiment of the present invention will now be described with reference to the drawings.

Figure 13A:
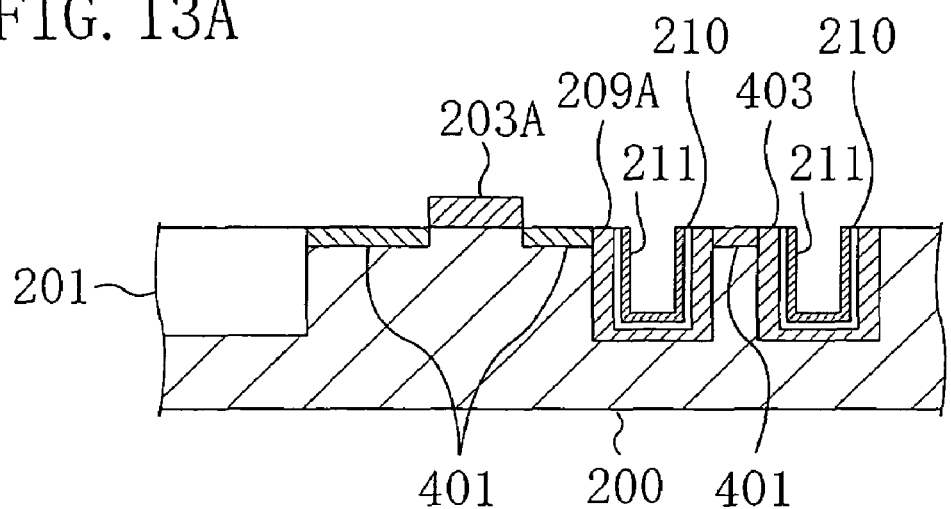
FIGS. 13A and 13B are cross-sectional views illustrating the configurations of memory cells in a first memory region $R_A$ and a second memory region $R_B$ of a semiconductor device according to a modification of the fourth embodiment of the present invention, respectively.
Figure 13B:
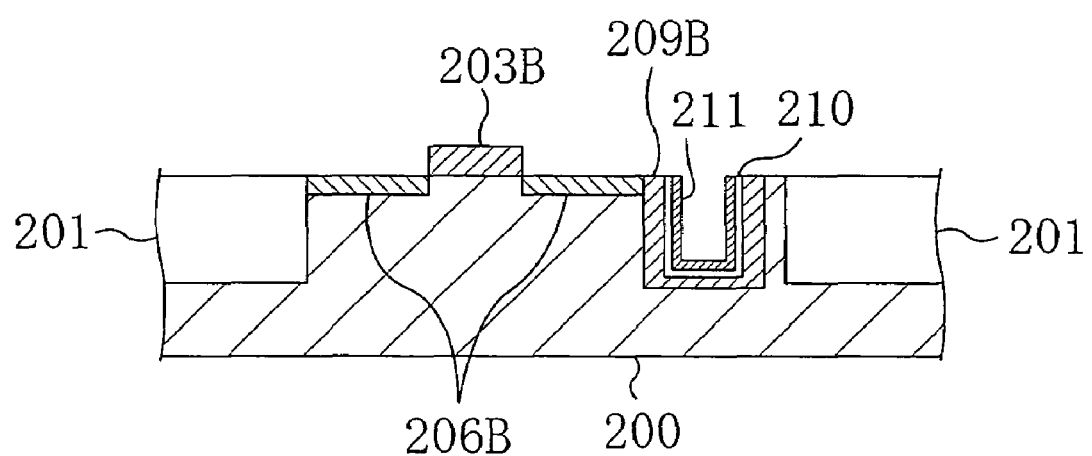
Figure 14A:
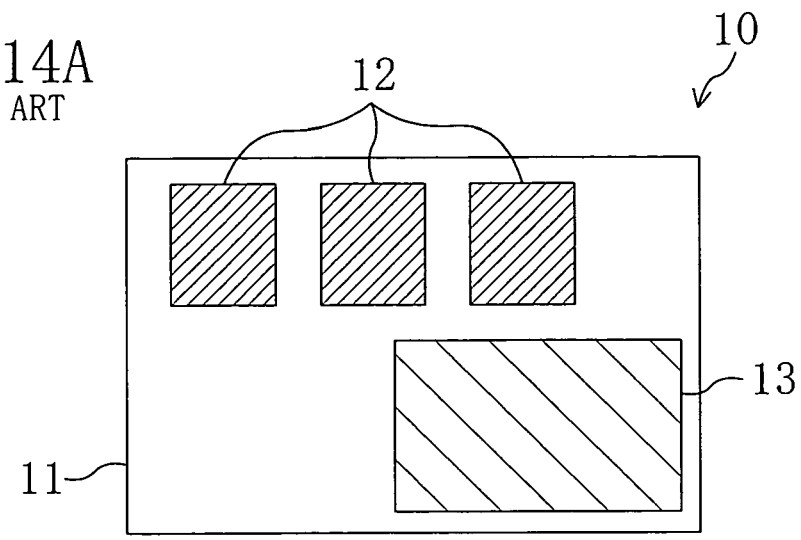
FIG. 14A is a plan view illustrating a general configuration of a conventional DRAM-embedded system LSI chip.
Figure 14B:
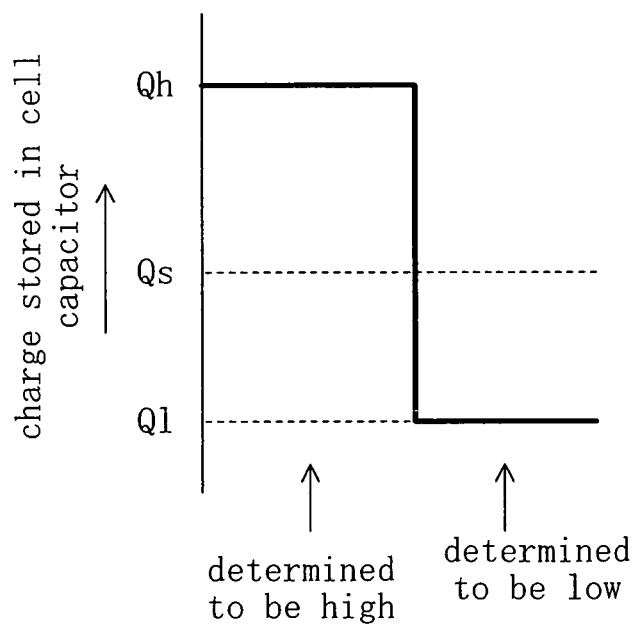
FIG. 14B is a graph illustrating the relationship between the reference charge and the charge stored in a cell capacitor of a first DRAM section and a second DRAM section illustrated in FIG. 14A.
Figure 14C:
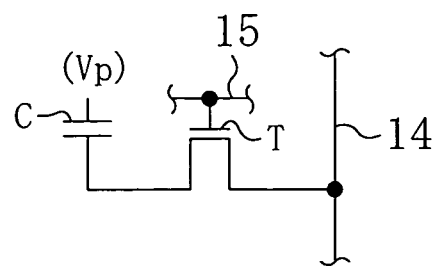
FIG. 14C is an equivalent circuit diagram illustrating a memory cell of the second DRAM section illustrated in FIG. 14A.

A planar configuration of the present modification is similar to that of the fourth embodiment illustrated in FIG. 10A. FIG. 13A is a cross-sectional view illustrating the configuration of a memory cell located in a first memory region $R_A$ in which a first DRAM section 102 of the present modification is formed, and FIG. 13B is a cross-sectional view illustrating the configuration of a memory cell located in a second memory region $R_B$ in which a second DRAM section 103 of the present modification is formed. Note that in FIGS. 13A and 13B, the same members as those of the semiconductor device of the second embodiment illustrated in FIGS. 10B and 10C will be denoted by the same reference numerals. Thus, a description thereof will not be given.

As illustrated in FIGS. 13A and 13B, the present modification is different from the fourth embodiment in that a capacitor of a trench structure is used instead of a capacitor of a stacked configuration. More particularly, in the present modification, cell capacitors located in both the memory regions $R_A$ and $R_B$ are embedded in trenches provided in the semiconductor substrate 200, and a capacitor lower electrode 209 of each cell capacitor is connected directly with an impurity diffusion layer.

The above-described modification also provides the effects similar to those of the fourth embodiment.

What is claimed is:

1. An amusement ride, comprising:
a track system;
an attachment assembly movably connected to the track system;
a vehicle assembly connected to the attachment assembly and including a seat assembly having at least one rider seat, the vehicle assembly including means for fully rotating the seat assembly about first, second and third axes independent of the track system.

2. The amusement ride of claim 1, wherein the track system comprises an endless roller coaster track, and wherein the attachment assembly comprises a bogey movably connected to the roller coaster track.

3. The amusement ride of claim 1, wherein the track system comprises at least one vertical tower track.

4. The amusement ride of claim 1, wherein the vehicle assembly includes a first arm extending from the attachment assembly and operably coupled to an actuator such that the first arm is freely or selectively rotatable about the first axis, and wherein the seat assembly is connected to a second arm that is rotatably connected to the first arm by an actuator such that the second arm is freely or selectively rotatable about a second axis independent of the first arm.

5. The amusement ride of claim 4, wherein the first arm comprises a generally semi-circular arm attached to a yaw actuator whereby yaw rotation is imparted to the arm, and wherein the second arm supporting the seat assembly extends generally transverse from an end portion of the semi-circular arm and is connected to a pitch actuator such that pitch rotation is imparted to the second arm.

6. The amusement ride of claim 5, including a roll actuator operably connected to the seat assembly such that roll rotation is imparted to the seat assembly.

* * * * *

UNITED STATES PATENT AND TRADEMARK OFFICE
CERTIFICATE OF CORRECTION

PATENT NO.       : 7,233,516 B2
APPLICATION NO. : 11/058372
DATED            : June 19, 2007
INVENTOR(S)      : Yoshiyuki Shibata It is certified that error appears in the above-identified patent and that said Letters Patent is hereby corrected as shown below:

Under "What is claimed is:", replace claims 1 - 6 with correct claims 1-6 as follows:

-- 1. A semiconductor device comprising:

a first DRAM section formed on a semiconductor substrate and composed of a plurality of first memory cells; and a second DRAM section formed on the semiconductor substrate and composed of a plurality of second memory cells, wherein each of the first memory cells has a first capacitive element, each of the second memory cells has a second capacitive element, a first operating speed, which is the operating speed of the first DRAM section is higher than a second operating speed, which is the operating speed of the second DRAM section, the capacitance of each said first memory cell is larger than that of each said second memory cell, and a voltage applied to the first capacitive element at the first operating speed is lower than a voltage applied to the second capacitive element at the second operating speed.

2. The semiconductor device of Claim 1, wherein the operating voltage of the first DRAM section is the same as that of the second DRAM section.

3. The semiconductor device of Claim 1, wherein the size of the first capacitive element is larger than that of the second capacitive element.

UNITED STATES PATENT AND TRADEMARK OFFICE
CERTIFICATE OF CORRECTION

PATENT NO. : 7,233,516 B2
APPLICATION NO. : 11/058372
DATED : June 19, 2007
INVENTOR(S) : Yoshiyuki Shibata It is certified that error appears in the above-identified patent and that said Letters Patent is hereby corrected as shown below:

4. A semiconductor device comprising:

a first DRAM section formed on a semiconductor substrate and composed of a plurality of first memory cells; and a second DRAM section formed on the semiconductor substrate and composed of a plurality of second memory cells, wherein the operating speed of the first DRAM section is higher than that of the second DRAM section, the capacitance of each said first memory cell is larger than that of each said second memory cell, and a capacitive element for each said first memory cell has a configuration obtained by combining two or more capacitive elements each for each said second memory cell.

5. The semiconductor device of Claim 4, wherein a lower electrode of the capacitive element in each said second memory cell is electrically connected through a corresponding plug to the semiconductor substrate, and a lower electrode of the capacitive element in each said first memory cell is composed of a plurality of adjacent electrode parts each having the same configuration as the lower electrode of the second memory cell, said plurality of electrode parts being electrically connected through a common plug to the semiconductor substrate.

UNITED STATES PATENT AND TRADEMARK OFFICE
CERTIFICATE OF CORRECTION

PATENT NO. : 7,233,516 B2
APPLICATION NO. : 11/058372
DATED : June 19, 2007
INVENTOR(S) : Yoshiyuki Shibata It is certified that error appears in the above-identified patent and that said Letters Patent is hereby corrected as shown below:

6. The semiconductor device of Claim 4, wherein a lower electrode of the capacitive element in each said second memory cell is electrically connected through a corresponding plug to a corresponding impurity layer in the semiconductor substrate, and a lower electrode of the capacitive element in each said first memory cell is composed of a plurality of adjacent electrode parts each having the same configuration as the lower electrode of the second memory cell, said plurality of electrode parts being electrically connected through individual plugs to a common impurity layer in the semiconductor substrate. --

Signed and Sealed this

Fourteenth Day of October, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,233,516 B2 |
| APPLICATION NO. | : 11/058372 |
| DATED | : June 19, 2007 |
| INVENTOR(S) | : Yoshiyuki Shibata |

It is certified that error appears in the above-identified patent and that said Letters Patent is hereby corrected as shown below:

Under "What is claimed is:", Column 28, line 53 thru Column 30, line 8, replace claims 1 - 6 with correct claims 1-6 as follows:

-- 1. A semiconductor device comprising:

a first DRAM section formed on a semiconductor substrate and composed of a plurality of first memory cells; and a second DRAM section formed on the semiconductor substrate and composed of a plurality of second memory cells, wherein each of the first memory cells has a first capacitive element, each of the second memory cells has a second capacitive element, a first operating speed, which is the operating speed of the first DRAM section is higher than a second operating speed, which is the operating speed of the second DRAM section, the capacitance of each said first memory cell is larger than that of each said second memory cell, and a voltage applied to the first capacitive element at the first operating speed is lower than a voltage applied to the second capacitive element at the second operating speed.

2. The semiconductor device of Claim 1, wherein the operating voltage of the first DRAM section is the same as that of the second DRAM section.

3. The semiconductor device of Claim 1, wherein the size of the first capacitive element is larger than that of the second capacitive element.

UNITED STATES PATENT AND TRADEMARK OFFICE
CERTIFICATE OF CORRECTION

PATENT NO. : 7,233,516 B2
APPLICATION NO. : 11/058372
DATED : June 19, 2007
INVENTOR(S) : Yoshiyuki Shibata It is certified that error appears in the above-identified patent and that said Letters Patent is hereby corrected as shown below:

4. A semiconductor device comprising:

a first DRAM section formed on a semiconductor substrate and composed of a plurality of first memory cells; and a second DRAM section formed on the semiconductor substrate and composed of a plurality of second memory cells, wherein the operating speed of the first DRAM section is higher than that of the second DRAM section, the capacitance of each said first memory cell is larger than that of each said second memory cell, and a capacitive element for each said first memory cell has a configuration obtained by combining two or more capacitive elements each for each said second memory cell.

5. The semiconductor device of Claim 4, wherein a lower electrode of the capacitive element in each said second memory cell is electrically connected through a corresponding plug to the semiconductor substrate, and a lower electrode of the capacitive element in each said first memory cell is composed of a plurality of adjacent electrode parts each having the same configuration as the lower electrode of the second memory cell, said plurality of electrode parts being electrically connected through a common plug to the semiconductor substrate.

UNITED STATES PATENT AND TRADEMARK OFFICE
CERTIFICATE OF CORRECTION

PATENT NO. : 7,233,516 B2
APPLICATION NO. : 11/058372
DATED : June 19, 2007
INVENTOR(S) : Yoshiyuki Shibata It is certified that error appears in the above-identified patent and that said Letters Patent is hereby corrected as shown below:

6. The semiconductor device of Claim 4, wherein a lower electrode of the capacitive element in each said second memory cell is electrically connected through a corresponding plug to a corresponding impurity layer in the semiconductor substrate, and a lower electrode of the capacitive element in each said first memory cell is composed of a plurality of adjacent electrode parts each having the same configuration as the lower electrode of the second memory cell, said plurality of electrode parts being electrically connected through individual plugs to a common impurity layer in the semiconductor substrate. --

This certificate supersedes the Certificate of Correction issued October 14, 2008.

Signed and Sealed this

Fourth Day of November, 2008

JON W. DUDAS
*Director of the United States Patent and Trademark Office*